(12) United States Patent
Xu et al.

(10) Patent No.: US 6,895,645 B2
(45) Date of Patent: May 24, 2005

(54) METHODS TO MAKE BIMORPH MEMS DEVICES

(75) Inventors: Baomin Xu, Cupertino, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 122 days.

(21) Appl. No.: 10/375,975

(22) Filed: Feb. 25, 2003

(65) Prior Publication Data

US 2004/0164649 A1 Aug. 26, 2004

(51) Int. Cl.[7] .......................... H04R 17/00; H01L 41/04
(52) U.S. Cl. ...................... 29/25.35; 29/830; 29/831; 29/832; 29/842; 29/846; 29/847; 310/328; 427/100; 156/230
(58) Field of Search .................. 29/25.35, 831, 29/846, 542, 832; 310/328, 330, 331, 332, 358, 359; 427/96, 100, 98, 99, 123; 156/230, 235, 237, 249, 233, 247, 289

(56) References Cited

U.S. PATENT DOCUMENTS

| | | | |
|---|---|---|---|
| 4,649,312 A | * | 3/1987 | Robin et al. ............. 310/330 |
| 5,034,649 A | * | 7/1991 | Chida et al. ............ 310/332 |
| 5,083,056 A | * | 1/1992 | Kondou et al. ........... 310/332 |
| 5,248,912 A | | 9/1993 | Zdeblick et al. |
| 5,268,611 A | * | 12/1993 | Culp ..................... 310/328 |
| 5,486,494 A | | 1/1996 | Hotchkiss et al. |
| 5,585,136 A | | 12/1996 | Barrow et al. |
| 6,071,795 A | | 6/2000 | Cheung et al. |
| 6,138,348 A | * | 10/2000 | Kulesza et al. ............. 29/840 |
| 6,262,516 B1 | | 7/2001 | Fukuda et al. |
| 6,335,263 B1 | | 1/2002 | Cheung et al. |
| 6,370,964 B1 | | 4/2002 | Chang et al. |
| 6,408,513 B1 | | 6/2002 | Kitahara et al. |
| 6,771,007 B2 | | 8/2004 | Tanielian |

| | | |
|---|---|---|
| 2002/0149196 A1 | | 10/2002 Fujii et al. |

FOREIGN PATENT DOCUMENTS

| | | |
|---|---|---|
| JP | 63150979 A | 6/1988 |
| JP | 02005325 A | 1/1990 |
| JP | 04023370 A | 1/1990 |
| JP | 02162782 A | 6/1990 |

OTHER PUBLICATIONS

Lee, Chin C., et al., *Au–In Bonding Below the Eutectic Temperature*; IEEE Transactions on Components, Hybrids, and Manufacturing Technology, vol. 16, No. 3, May 1998, pp. 311–316.

Chen, Yi–Chia, *Indium–Copper Multilayer Composites for Fluxless Oxidation–Free Bonding*; Thin Solid Films 283 (1996), pp. 243–246; 1996 Elsevier Science S.A.

(Continued)

*Primary Examiner*—A. Dexter Tugbang
*Assistant Examiner*—Tai Van Nguyen
(74) *Attorney, Agent, or Firm*—Fay, Sharpe, Fagan, Minnich & McKee, LLP

(57) ABSTRACT

A bimorph structure is produced by depositing a first material on a first surface of a first substrate to form a first element structure. A second material is deposited onto a surface of a second substrate to form a second element structure. Electrodes are deposited on a surface of each of the first element structure and the second element structure. The first element structure is bonded to a first transfer substrate, and the second element structure is bonded to a second transfer substrate. The first substrate is removed from the first element structure, and the second substrate is removed from the second element structure. Second side electrodes are deposited on a second surface of each of the first element structures and the second element structure. The first element structure and the second element structure are directly bonded to each other. One of the first transfer substrate and the second transfer substrate is then removed, and the surface of the element structure from which one of the transfer substrates has been removed is bonded to a final target substrate. Thereafter, the other transfer substrate is removed, and electrical connections are made.

12 Claims, 24 Drawing Sheets

OTHER PUBLICATIONS

Mathelin, D., et al., *Improved Microcontact Technology*, The Compete Network presents Immico, (BE–8225), Up–dated: Spring 1998, pp. 1–9.

Sayer, M., et al., *Macroscopic Actuators Using Thick Piezoelectric Coatings*; Mat. Res. Soc. Symp. Proc., vol. 655, 2001 Materials Research Society; pp. CC13.6.1–CC13.6.11.

Lin, Mark, et al., *The Manufacture of Composite Structures with a Built–in Network of Piezoceramics*; Composites Science and Technology, 62 (2002), pp. 919–939.

Tsakalakos, L. et al., *Epitaxial Ferroelectric (Pb,La)(Zr Ti)$O_3$ Thin Films on Stainless Steel by Excimer Laser Liftoff*; Applied Physics Letters, Jan. 10, 2000, vol. 76, No. 2, pp. 227–229.

Tsakalakos, L. et al., *Excimer Laser Liftoff of Epitaxial Pb(Zr, Ti)$O_3$ Thin Films and Heterostructures*; Mat. Res. Soc. Symp. Proc., vol. 596, 2000 Materials Research Society, pp. 549–557; Ferroelectric Thin Films VIII, Nov. 29–Dec. 2, 1999.

Lukacs, M. et al., *Novel PZT Films for Ultrasound Biomicroscopy*; 1996 IEEE Ultrasonics Symposium, pp. 901–904.

Zou, L. et al., *Sol–Gel Fabricated Thick Piezoelectric Ultrasonic Transducers for Potential Applications in Industrial Material Processes*; 1997 IEEE Ultrasonics Symposium, pp. 1007–1011.

Barrow, et al., *Characterization of Thick Lead Zirconate Titanate Films Fabricated Using a New Sol Gel Based Process*; J. Appl. Phys. 81 (2), Jan. 15, 1997, 1997 American Institute of Physics, pp. 876–881.

Wong, W.S., et al., *Integration of GaN Thin Films with Dissimilar Substrate Materials by Pd–In Metal Bonding and Laser Lift–Off*; Journal of Electronic Materials, vol. 28, No. 12, 1999, pp. 1409–1413.

Chen, Yi–Chia, et al., *A Fluxless Bonding Technology Using Indium–Silver Multilayer Composites*; IEEE Transactions on Components, Packaging, and Manufacturing Technology—Part A., vol. 20, No. 1, Mar. 1997, pp. 46–51.

\* cited by examiner

FIG. 10
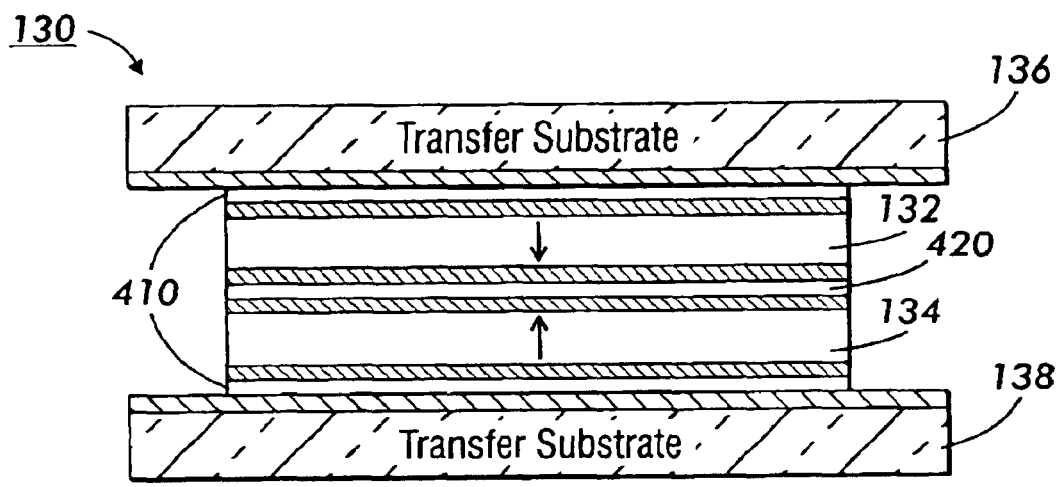
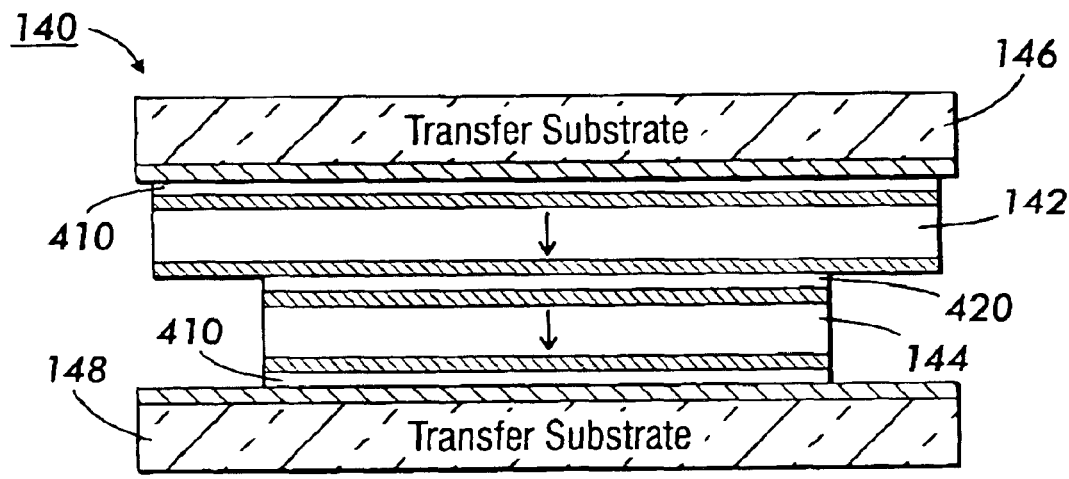
FIG. 11

METHODS TO MAKE BIMORPH MEMS DEVICES

BACKGROUND OF THE INVENTION

Piezoelectric materials, especially piezoelectric ceramics such as PZT (lead zirocnate titanate) are the most widely known materials used for the manufacture of actuators, sensors and transducers among all ferroelectric-type materials (poled ferroelectric material is piezoelectric material). Recently, however, other materials have begun to be developed for use as actuators, sensors, and transducers, which have some beneficial properties not found in piezoelectric materials. One of these materials is an antiferroelectric material, such as antiferroelectric ceramics found in PZT or PZST (lead zirconate stannate titanate) systems.

Antiferroelectric materials have anti-parallel dipoles which can be transferred into a parallel state (ferroelectric state) under an applied field, thus double hysteresis loops will appear on their P (polarization)-E (electric field) curve. A large strain (about 0.4% to 0.8%) accompanies an antiferroelectric-ferroelectric phase switching, which is four to eight times higher than that which can be reached in most piezoelectric ceramics (usually less than 0.1%). Additionally, different types of antiferroelectric materials may be used to generate different strain levels within this approximate 0.4% to 0.8% range.

Antiferroelectric materials are uni-directional actuators, that is, no matter the direction of the applied field, the material will always expand. Also, the mentioned large strain jump around the phase switching field, is a "digital" type actuation characteristic, which makes antiferroelectric materials suitable for ON/OFF actuation applications such as a pump. Antiferroelectric materials also have a minus Poisson's ratio. This means that, during the antiferroelectric/ferroelectric phase switching, the material will expand in all directions. Still a further characteristic of antiferroelectric material is that it does not require a poling operation as needed by piezoelectric materials.

Thus, due to their physical characteristics, both piezoelectric and antiferroelectric materials are considered useful in the fabrication of structures which morph from one position to another. Therefore, both materials are used in unimorph macro-world sized designs, i.e., where a single morphing film layer is used. Piezoelectric materials are also used in macro-world sized bimorph structures. However, antiferroelectric/antiferroelectric bimorph macro-world sized structures are not available due in part to the described nature of antiferroelectric material.

Additionally, while it is known bimorphs can provide as much as twice the voltage or charge of unimorphs under the same mechanical loading, and can provide twice the displacement of unimorphs under the same electric driving condition, only piezoelectric and antiferroelectric unimorphs are now used in microelectro-mechanical dimensioned (MEMS) systems. MEMS-type bimorphs have not been developed due at least in part to manufacturing obstacles related to building two piezoelectric or antiferroelectric thin or thick film layers together, or in combination with each other. A further obstacle is developing a system which is able to pole the piezoelectric layers with suitable directions, and to make antiferroelectric/antiferroelectric bimorphs move along two directions.

As mentioned, piezoelectric bimorph and unimorph bending devices have been used in macro-world sized designs. These devices, made from bulk ceramics, can be fabricated as a cantilever, diaphragm or other structure to then be used as sensors, actuators, and transducers. Shown in FIGS. 1A–1C are cantilever bimorph and unimorph macro devices.

Piezoelectric bimorph devices 10 of FIGS. 1A and 12 of FIG. 1B each consist of two ceramic plates bonded together in two types of connections often used in bimorph fabrication. In FIG. 1A, a series or anti-parallel connection 14 is used in which the two piezoelectric sheets 16, 18 with opposite polarization directions are bonded together, and the electrical connection 20 is applied by electrodes 22, 24 across the total thickness. FIG. 1B is a parallel connection 26, in which two piezoelectric sheets 28, 30 with the same polarization direction, are bonded together, and an electrical connection 32 is applied between an intermediate electrode 34 and the top/bottom electrodes 36, 38.

The unimorph actuator 40 of FIG. 1C consists of either one piezoelectric or antiferroelectric sheet 42 and one passive metal plate 44, such as metal plate bonded together. Unimorph 40 is driven by electrical connection 46, which is in contact with metal plate 44 and electrode 48.

Because bimorphs consist of two active layers and unimorphs consist of one active layer and one passive layer, bimorphs are more efficient devices than unimorphs. For example, in sensor applications under the same mechanical loading, the induced charge (for a parallel-connected piezoelectric bimorph) or the induced voltage (for a series-connected piezoelectric bimorph) doubles that of a unimorph with the same dimensions. Therefore, in actuator applications, under the same driving condition, the tip displacement of a bimorph will double that of a unimorph.

As it is difficult to make bulk piezoelectric ceramic sheets with a thickness less than 100 $\mu$m, the thickness of the piezoelectric sheets used in bimorphs and unimorphs are usually from several hundreds $\mu$m to several mm.

One reported fabrication of MEMS thin and thick film bimorphs is by depositing piezoelectric thin or thick films on both sides of a metal plate or foil through sputtering or hydrothermal growth processes. The thickness of the metal plate or foil is commonly thicker than 25 $\mu$m. Due to the size of the metal plate or foil, a passive or dampening effect must be taken into account with such "triple layer" bimorphs. Due to the dampening effect, the bimorphs created by this process, are not as efficient as "true" bimorphs made by direct bonding of two films or layers together.

The state of the art does not provide an efficient high-yield process for the manufacture of true bimorph-based structures in the MEMS scale, where the layers are piezoelectric/piezoelectric, antiferroelectric/antiferroelectric or antiferroelectric/-piezoelectric combinations. Also, usable antiferroelectric/antiferroelectric macro-sized bimorph structures are not now available.

While MEMS thick film bimorph devices, with a piezoelectric film thickness between 10 to 100 $\mu$m, are desirable as it would provide a larger force and broader working frequency range than MEMS thin film bimorphs, MEMS thick film bimorphs in this range have also not been produced. This is due at least in part to current film production processes which fail to provide an efficient manner of producing piezoelectric films within this range, and therefore no consideration has been given to making two-layer thick films together in this range.

SUMMARY OF THE INVENTION

A bimorph structure is produced by depositing a first material on a first surface of a first substrate to form a first element structure. A second material is deposited onto a surface of a second substrate to form a second element structure. Electrodes are deposited on a surface of each of the first element structure and the second element structure. The first element structure is bonded to a first transfer substrate, and the second element structure is bonded to a second transfer substrate. The first substrate is removed from the first element structure, and the second substrate is removed from the second element structure. Second side electrodes are deposited on a second surface of each of the first element structures and the second element structure. The first element structure and the second element structure are directly bonded to each other. One of the first transfer substrate and the second transfer substrate is then removed, and the surface of the element structure from which one of the transfer substrates has been removed is bonded to a final target substrate. Thereafter, the other transfer substrate is removed, and electrical connections are made.

In a further embodiment, a micro-electromechanical dimensioned bimorph structure includes a first element structure, and a second element structure. A bonding layer bonds the first element structure directly to the second element structure.

SUMMARY OF THE DRAWINGS

The invention may take form in various components and arrangements of components, and in various steps and arrangements of steps. The drawings are only for purposes of illustrating preferred embodiments and are not to be construed as limiting the invention.

FIG. 10 is an embodiment of the present application wherein the two film elements are series-connected piezoelectric elements bonded as a single arrangement;

FIG. 11 depicts another embodiment where the bonded film elements are two piezoelectric elements bonded in parallel connection;

DETAILED DESCRIPTION OF THE INVENTION

Figure 1A:
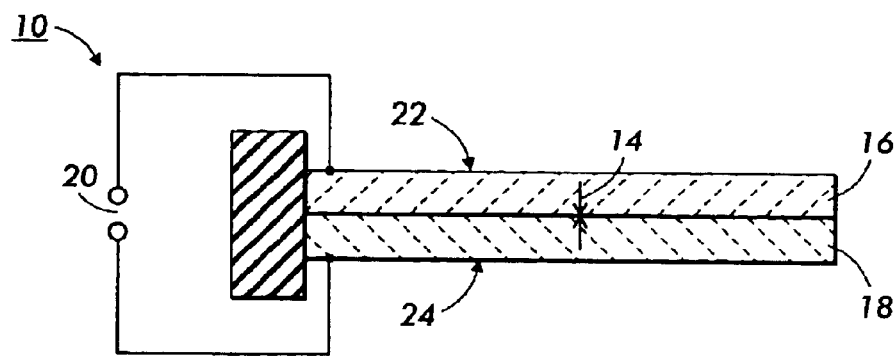
FIGS. 1A and 1B illustrate alternative designs of a bimorph configuration.
Figure 1B:
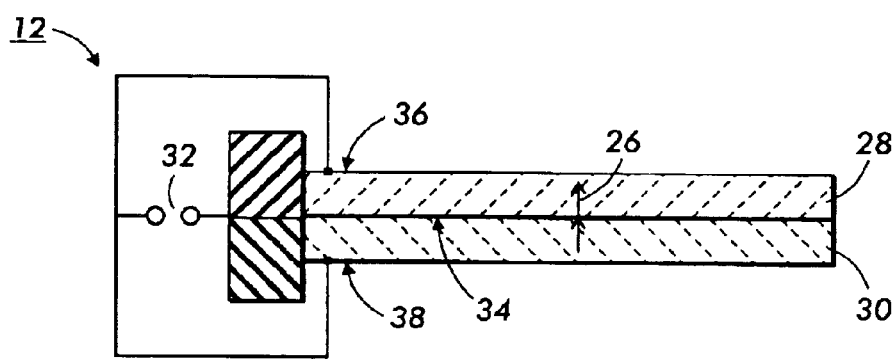
Figure 1C:
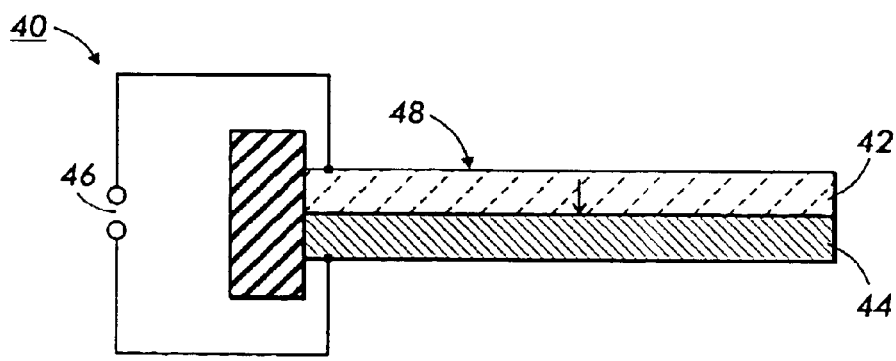
FIG. 1C illustrates a unimorph configuration using a neutral substrate.

In consideration of the discussion in connection with FIGS. 1A–1C, the combination of piezoelectric materials and MEMS technologies, has permitted the development of thin film (with film thickness usually between 1 to 10 $\mu$m) type MEMS unimorph cantilevers and diaphragms on silicon substrates. Among other uses, cantilever unimorphs have been used as sensors such as accelerometers and force sensors for atomic force microscope (AFM). Diaphragm unimorphs have been used, for example, as acoustic sensors such as sonar and actuators such as for pumping or ejecting fluid via micro-pumps. The piezoelectric thin films, usually PZT, for such uses are made by sol-gel, sputtering, laser ablation, chemical vapor deposition or other appropriate process. The film thickness is less than 10 $\mu$m as these processes do not lend themselves to making thick films (with film thickness between 10 $\mu$m to 100 $\mu$m). On the other hand, as all these processes need to anneal the piezoelectric films at least above 500° C., these thin film unimorph actuators cannot be made on substrates—such as plastic—not capable of withstanding such high temperatures.

The following discussion discloses manufacturing steps which extend the existing state of the art to provide thin and thick film piezoelectric/piezoelectric, antiferroelectric/antiferroelectric, or antiferroelectric/piezoelectric true bimorph structures bonded on many kinds of substrates including silicon, metal and plastic. The structures described in the following will focus on cantilevers or diaphragms for use in devices such as microsensors and microactuators. However, the process may be used for production of other structures.

Figure 2:
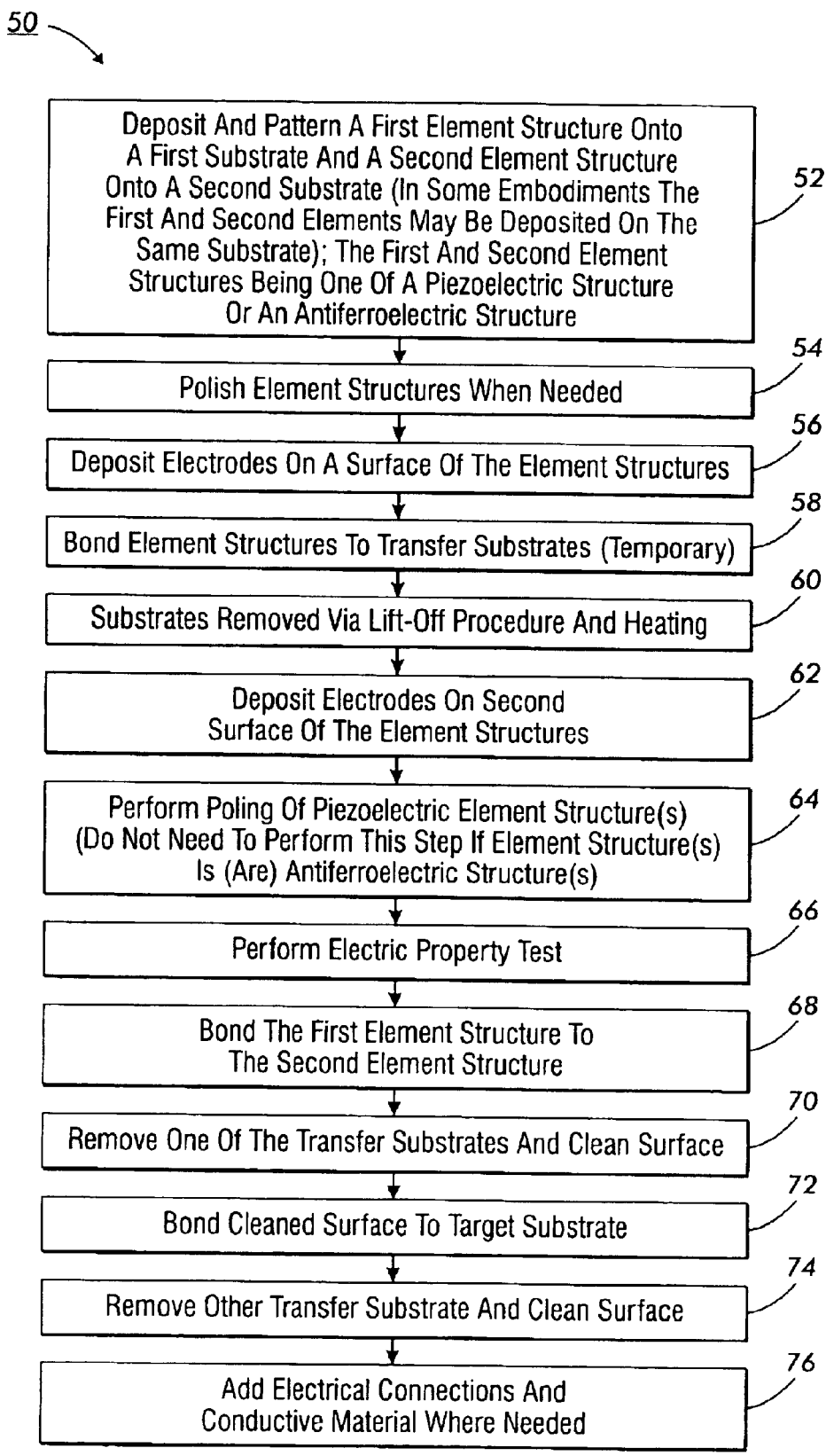
FIG. 2 is a high-level flowchart for a first embodiment of a process according to the present application.

A process to manufacture the mentioned bimorph structures is illustrated in the high level process flow 50 of FIG. 2. While the following discussion focuses on producing thin and thick film bimorph piezoelectric, antiferroelectric and piezoelectric/antiferroelectric based structures, it is to be appreciated the disclosed process may also be used with other materials and with material greater than the thick film range.

Initially, ferroelectric-type material, such as piezoelectric and/or antiferroelectric ceramic material, is fabricated on two separate, appropriate substrates. Thin films, of approximately 1 to 10 $\mu$m, can be made by the mentioned sol-gel, sputtering, hydrothermal, CVD, or other appropriate thin film technique, where, for example, an annealing step at about 500° C. or greater takes place. After annealing, the films may be patterned to the desired configuration using a dry etching method such as plasma etching or wet chemical etching methods. Thick films, of more than 10 $\mu$m to 100 $\mu$m, or greater, are made by use of a direct marking technology, such as screen printing, jet printing or acoustic ejection 52. The fabrication process includes sintering the material for densification. Preferably, this process takes place at a temperature of greater than 600° C. and more preferably between approximately 1100 to 1350° C. Other temperature ranges for annealing and/or sintering may also be used in appropriate circumstances.

Following fabrication of the element structures, the surface of the element structures formed by a direct marking process are polished 54, preferably using a dry tape polishing technique (thin film elements may not require polishing). Once those elements requiring polishing and/or cleaning have been addressed, electrodes are deposited on the surface of the elements 56 by techniques such as sputtering or evaporation with a shadow mask. Electrodes can also be deposited by one of the direct marking methods, such as screen printing, and sintered at suitable temperatures. Next, the elements on each substrate are temporarily bonded to transfer substrates 58 using an appropriate bonding process.

At this point, the substrates on which the elements were formed are removed through a liftoff process 60, using radiation energy, such as from laser or other appropriate device. The releasing process involves laser exposure (or other radiation source) to the elements through the substrate, to break an attachment interface between the substrate and the elements. Additional heating is implemented, if necessary, to complete removal of the substrate. Once the liftoff process has been completed, a second electrode is deposited on a second surface of the elements 62. Thereafter, poling of the piezoelectric elements under high voltage obtains piezoelectric properties in the material 64. The electric property, such as the dielectric property, of each element is then measured 66 to identify if the elements meet required criteria.

Next, a first element of the elements is bonded to a second element of the elements 68. Following this bonding operation, one of the transfer substrates is removed. The removal may be achieved via a laser liftoff process or other appropriate technique. By removal, a surface of one of the elements is exposed, and this surface may be cleaned 70. The clean surface of that element is then bonded to a final target substrate or system 72, and the other transfer substrate is removed and the exposed surface is cleaned 74. Thereafter, in step 76 electrical connections are made, where needed, to provide the manufactured arrangements with power. This step may include putting conductive material, such as conductive epoxy, to the arrangement in order to create the electrical connections.

Employing the process of FIG. 2, only fully tested elements will be bonded to final target substrates, thus avoiding yield loss of the target substrates. Further, the described process permits the arrangement produced by the steps of FIG. 2, to be bonded to a target substrate having a maximum temperature without damage below the annealing and/or sintering temperatures. Potentially, the maximum temperature without damage may be only slightly greater than the temperatures used in the final bonding operations (Step 72). The process of FIG. 2 thus permits for high volume, high usable yields, i.e. greater than 60 percent and more preferably over 90 percent, and still yet more preferably greater than 98 percent.

Figure 3:
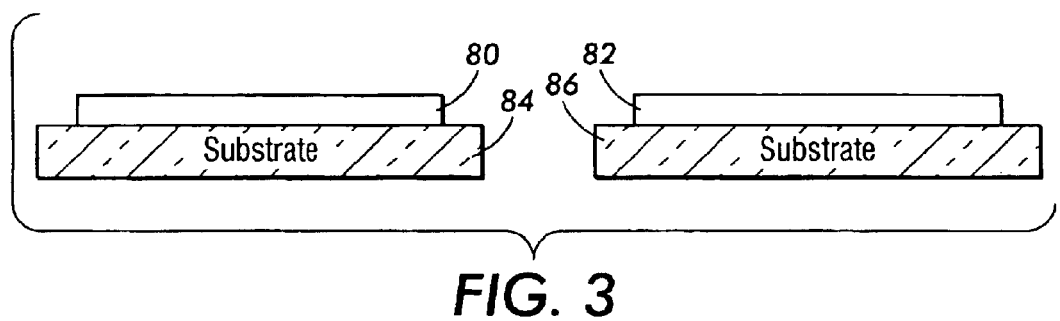
FIG. 3 depicts a pair of substrates with an element deposited thereon.

With attention to FIG. 3, which illustrates step 52 in greater detail, elements 80, 82 represent piezoelectric and/or antiferroelectric elements, formed on, respectively, substrates 84, 86. When the film is a thin film of about 10 $\mu$m or less, the previously mentioned manufacturing techniques are used, including annealing the material at a temperature of about 500° C. or greater. After annealing, the films may be patterned to the desired configuration using a dry etching method such as plasma etching or wet chemical etching methods. For films with a thickness greater than 10 μm, the depositing step may be achieved by a number of direct marking processes including screen printing, jet printing, ballistic aerosol marking (BAM) or acoustic ejection, among others. The material is then sintered at a temperature above about 600° C., and preferably between approximately 1100 to 1350° C. for densification. Using these techniques permits flexibility as to element configurations. For example, when the elements are made by screen printing, a screen printing mask (mesh) can be designed to have various shapes or openings resulting in a variety of shapes for the elements, such as rectangular, square, circular, strip, among others. Use of direct marking and the other mentioned techniques also permit generation of very fine patterns.

If intermediate electrodes of the final fabricated bimorph are to be connected to an external circuit, one element may have a dimension slightly different from the other elements, or one element may have a small notch or cutout on the edge at a suitable place. Therefore, after bonding of the two elements together a small part of the intermediate electrodes can be exposed to the external circuit.

The substrates used in the processes of this application will have certain characteristics, due to the high temperatures involved and—as will be discussed in greater detail—that the substrate is to be transparent for the liftoff process. Specifically, the substrate is to be transparent at the wavelengths of a radiation beam emitted from the radiation source, and is to be inert at the annealing and sintering temperatures so as not to contaminate the materials. A particularly appropriate substrate is sapphire. Other potential substrate materials include transparent alumina ceramics, aluminum nitride, magnesium oxide, strontium titanate, among others. In one embodiment of the process, the substrates selected are transparent for an excimer laser operating at a wavelength of 308 nm, and do not have any requirement on their crystallographic orientation. It is preferable that the selected substrate material be reusable, which will provide an economic benefit to the process. Also, while substrates 84 and 86 are shown as separate substrates to carry a single element each, it is to be understood that elements may be formed on the same substrate, in particular applications.

After fabrication of the elements has been completed, the process moves to step 54. At this juncture, the elements which are thick-film elements formed via a direct marking process may have their top surfaces polished through a tape polishing process to remove undue roughness or any surface damage layer, such as due to lead deficiency. If the surface is planned to be used as a bottom surface which will be bonded to a surface-conductive substrate using thin nonconductive epoxy bonding (this technique will be described in greater detail herein), the surface roughness is controlled in a range of about 0.5 to 5 μm in order to maintain electric contact. This roughness may be obtained via a rough tape polishing technique, sandblasting, or other know method for achieving a defined surface roughness. For other bonding methods, the surface can be very smooth. Thin-films may also need to be processed to increase the surface roughness in certain applications. It is to be understood the surface roughnesses for the thick and/or thin film elements will be a small fraction of the overall thicknesses of these elements. The specific roughness being selected in accordance with a particular implementation.

Figure 4:
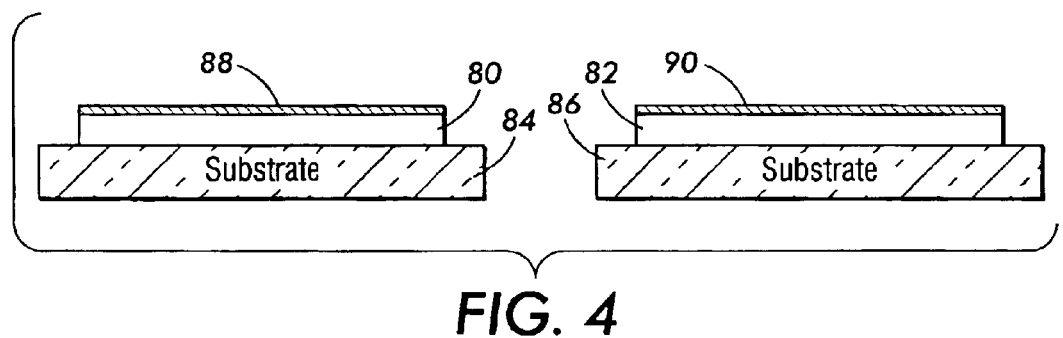
FIG. 4 depicts the arrangement of FIG. 3 with an electrode deposited on an upper surface of the material.

Once polishing has been completed, the surfaces are cleaned, in one instance by application of a cleaning substance. After polishing and cleaning, the process moves to step 56 where, as shown in FIG. 4, metal electrodes 88, 90 such as Cr/Ni or other appropriate materials, are deposited on the surface of the elements 80, 82 by techniques such as sputtering, evaporation with a shadow mask or other technique such as by direct marking.

The elements 80, 82 with the now-formed electrodes 88, 90 are, as recited in step 58, bonded to transfer substrates 92, 94 of FIG. 5. The bonding between the element and the transfer substrate is intended to be temporary, which means the detachment between the element and the substrate should be realized by a liftoff process or other appropriate methods. In order to undertake poling for the piezoelectric elements and electric property testing, such as a dielectric property test, to identify if the elements meet required criteria, the substrate or surface of the substrate is conductive, and the bonding process acts to maintain electric contact between the electrodes and the surface of the substrate. More preferably, the transfer substrate is transparent, thus the alignment can be easily realized when bonding the two elements together (Step 68) and bonding the bimorph to the target substrate (Step 72). One particular substrate material which can be used is ITO (Indium-tin oxide) coated glass, but other substrates which are transparent and conductive or have a surface conductive layer can also be used.

Figure 5A:
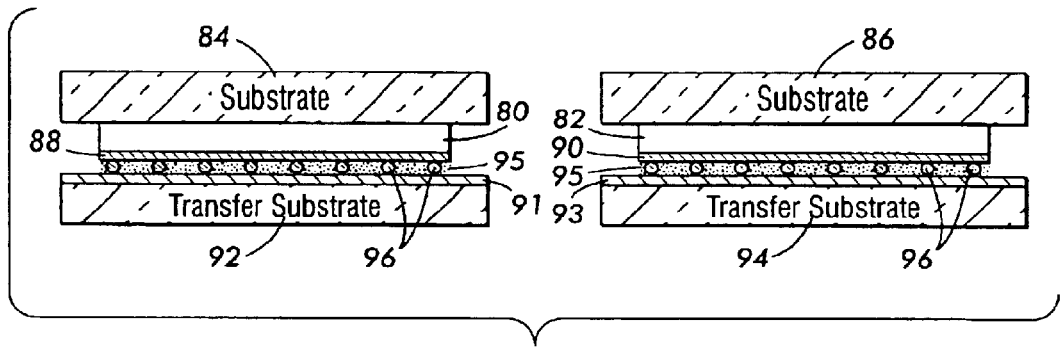
FIG. 5A shows bonding of the arrangement of FIG. 4 to a transfer substrate using a thin, nonconductive epoxy bonding containing sub-µm (micrometer) conductive balls.

A number of bonding techniques may be employed for bonding, between the elements and the associated transfer substrates. For example, as depicted in FIG. 5A, elements 80 and 82 are bonded to each of transfer substrates 92 and 94 using the thin and nonconductive epoxy 95 containing sub-μm conductive particles, such as conductive balls 96. The transfer substrates 92 and 94 are transparent and each has a surface conductive layer 91 or 93 which is also transparent, such as an ITO-coated glass. The nonconductive epoxy layer 95 can be as thin as less than 1 μm and contain sub-μm conductive balls (such as Au balls) 96 so the epoxy is conductive in the Z direction (the direction perpendicular to the surface of the ITO 91 or 93). Thus electric contact is maintained between the surface electrodes 88 or 90 of the elements 80 or 82 and the substrates 92 or 94. The concentration of the conductive balls can be controlled in such a range that the cured thin epoxy is conductive in the Z direction but not conductive in the lateral directions, as done for the anisotropic conductive films. The shrinkage of the epoxy maintains contact between the surfaces and the balls in the Z direction.

Figure 5B:
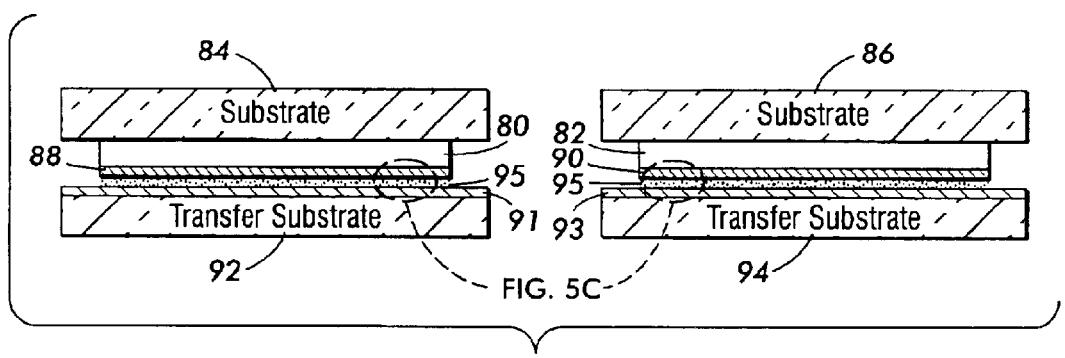
FIG. 5B shows a thin nonconductive epoxy bonding process.
Figure 5C:
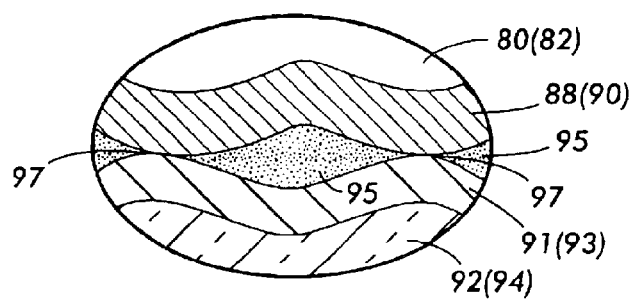
FIG. 5C is an enlarged view of a section of FIG. 5B.

In an alternative embodiment shown in FIG. 5B and 5C, conductive balls 96 are removed, and bonding is accomplished using the nonconductive epoxy layer 95 alone. As shown in more detail by FIG. 5C, with controlled suitable surface roughness or asperity of the film elements and/or the substrate, electrical contact is maintained via electrical contact points 97, formed when the surface of the electrodes and substrate are moved into contact. For this type of bonding, the surface roughness of the elements and/or substrate is controlled in a range of about 0.5 to 5 μm, and this roughness may be obtained via a rough tape polishing technique, sandblasting, or other known method for achieving a defined surface roughness before the bonding process. The surface roughness will be a small fraction of the overall thickness of the elements and/or substrate. The specific roughness being selected in accordance with a particular implementation.

Figure 5D:
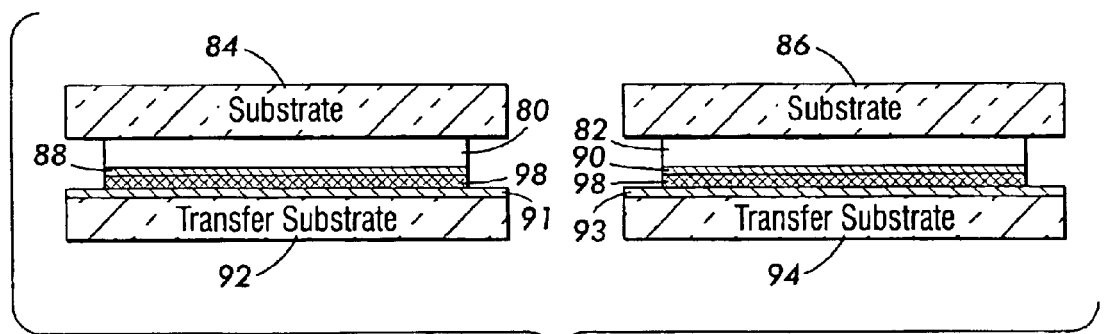
FIG. 5D shows a removable, conductive tape bonding.

In a further embodiment shown in FIG. 5D, bonding to the transfer substrate may be accomplished by using conductive, removable polymer tape 98, such as 9712, 9713 and 9719 conductive tape from 3M Corporation.

In general it is desired that the transfer substrate is conductive or has a surface conductive layer, such that bonding maintains electric contact between the electrodes on the elements and the surface conductive layer of the transfer substrate. A case where this is not necessary is if the elements 80 and 82 are composed of antiferroelectric material, which does not require the poling operation, and the final substrate or system is sufficiently inexpensive so that electric property testing, such as dielectric property testing, during the fabrication process is not performed. In this case the element can be bonded to a nonconductive substrate or a substrate without a surface conductive layer, using either a removable nonconductive tape or a nonconductive epoxy bonding layer which does not need to be very thin.

Figure 5E:
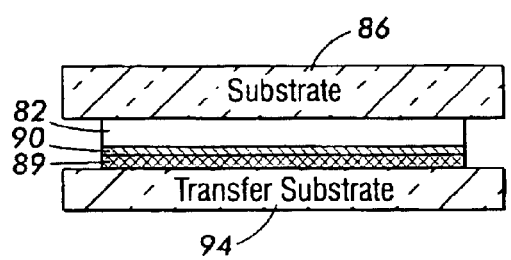
FIG. 5E shows a removable, nonconductive tape bonding.

As the embodiment shown in FIG. 5E, the antiferroelectric element 82 is bonded to the nonconductive transfer substrate 94 using a nonconductive, removable tape 89. The removable tape may be replaced by using a conventional nonconductive epoxy bonding layer and this bonding layer does not need to be very thin.

While in these FIGURES the elements 80 and 82 are bonded to each transfer substrate using the same bonding method, in operation they could be different. For example, element 80 may be bonded to the transfer substrate 92 using a thin nonconductive epoxy containing sub-$\mu$m conductive balls and element 82 may be bonded to the transfer substrate 94 using a removable, conductive tape. For simplification in the following drawings and descriptions the bonding between the element and the transfer substrate with surface conductive layer is simply designated as bonding layer 410. It is to be appreciated that the bonding layer 410 should be understood as various ones of the described bonding methods or other appropriate bonding method.

Figure 6:
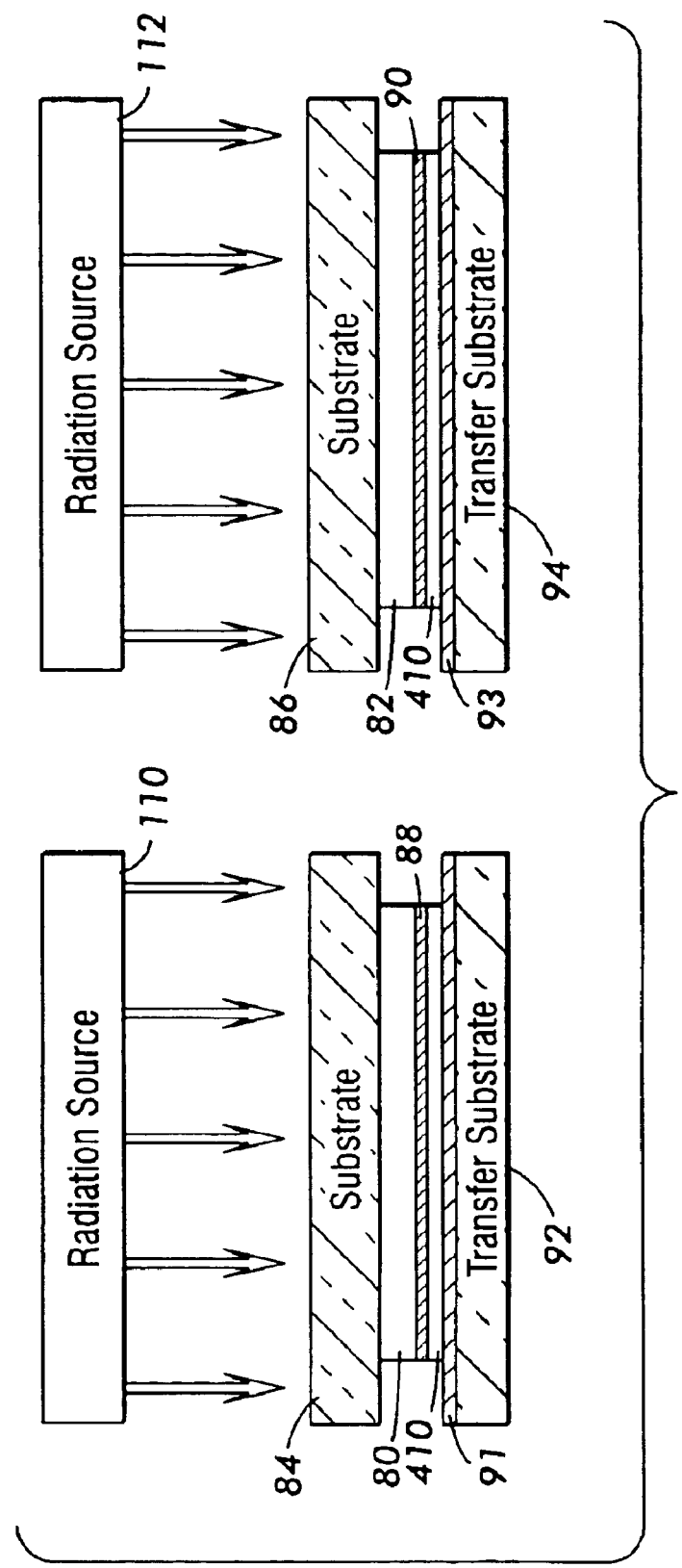
FIG. 6 depicts a liftoff process.
Figure 7:
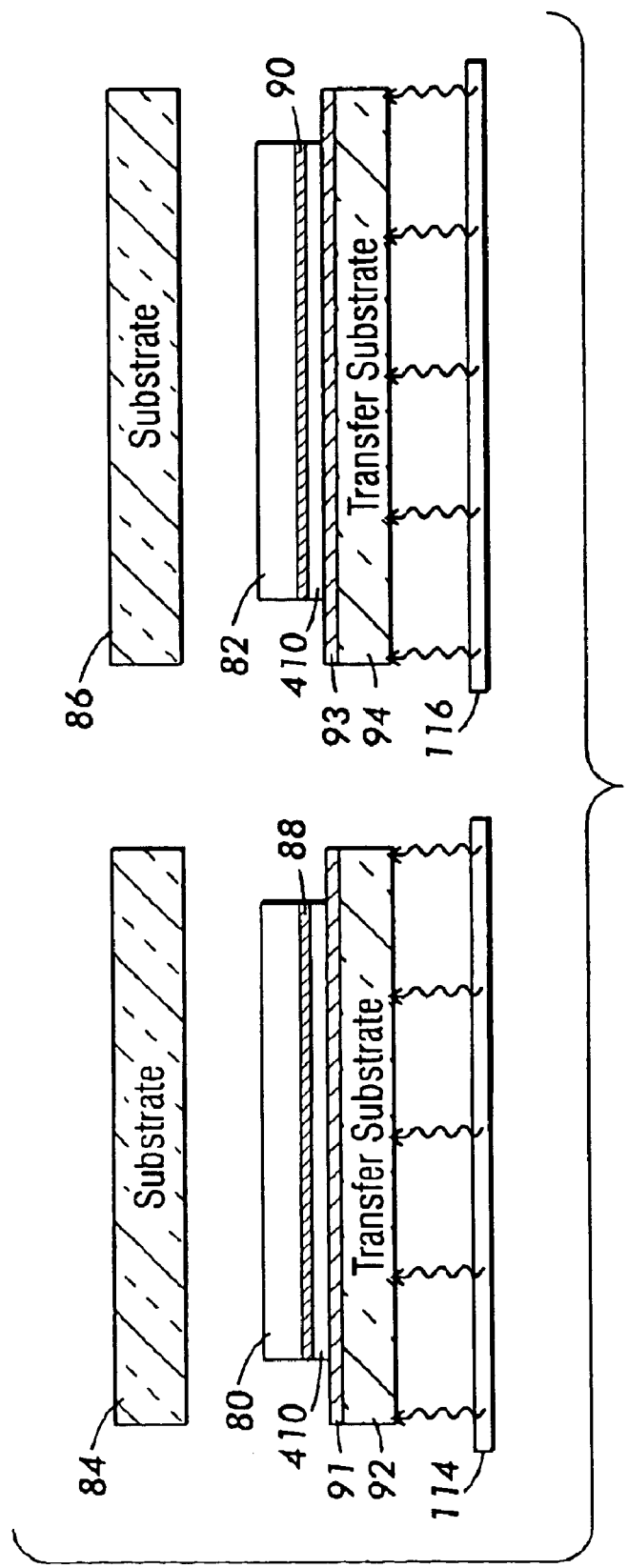
FIG. 7 describes a heating process used with the liftoff process.

Once the elements have been bonded to the transfer substrates 92, 94 (step 58 of FIG. 2), the next step is to release the elements 80, 82 from substrates 84, 86. The releasing of the substrates is accomplished, in one embodiment, by a liftoff operation as depicted in FIGS. 6 and 7. Substrates 84, 86 are first exposed to energy from a radiation source (in one embodiment, this radiation source may be a laser emitting laser beams) 110, 112, having a wavelength at which the substrates 84, 86 are substantially transparent. In this way a high percentage of the beam passes through the substrates 84, 86 to the interface of the substrates 84, 86 and elements 80, 82 at the surface of the substrates. The energy at the interface acts to release the physical attachment between these components. Following operation of the radiation exposure, and as shown in FIG. 7, heat is applied by heaters 114, 116. While the temperature provided by the heaters will vary depending on the situation, in one embodiment a temperature of between 40 to 50° C. is sufficient to release any remaining contacts between the elements 80, 82 and substrates 84, 86. Desirably, the substrates are of a material that allows re-use.

Exposure to the radiation source does raise the potential of damage to the surface of the elements, this potential damage should however be no more than to a thickness of about 0.1 $\mu$m. When the thickness of the elements, is larger than 10 $\mu$m, the effect of the surface damage layer can be ignored. However, if otherwise necessary or when elements of less than 10 $\mu$m thick are formed by these processes, any surface damage layer can be removed by appropriate processes including ion milling or tape polishing. It is to be appreciated FIGS. 6 and 7 are simply used as examples, and the described liftoff process may take place using alternatively described arrangements.

Figure 8:
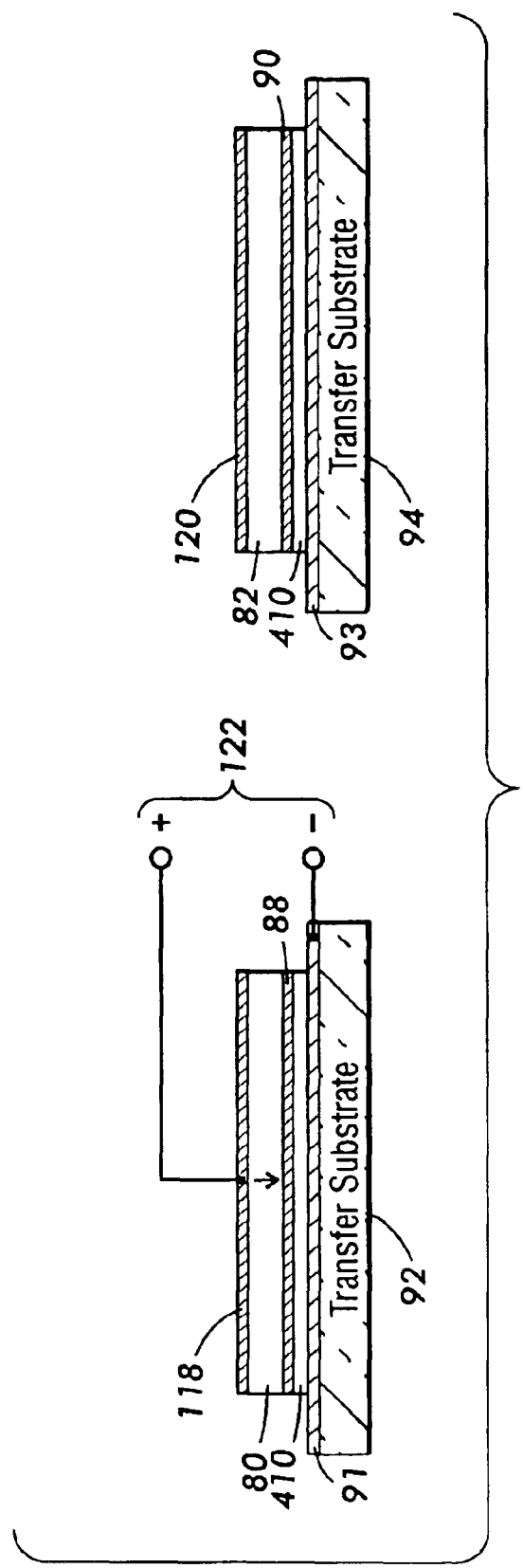
FIG. 8 shows the pair arrangement wherein a second electrode has been deposited and material which requires poling has a poling operation performed.

Next, as depicted in FIG. 8, second side surface electrodes 118, 120, such as Cr/Ni, are deposited on the released surfaces of elements 80, 82 with a shadow mask or by other appropriate method in accordance with step 62 of FIG. 2. It is to be noted that some ends or edges will not be covered with electrode to avoid short circuitry of the final device. After second electrode deposition, the process moves to step 64, where the piezoelectric elements (as an example for this discussion element 80) are poled under a voltage 122 sufficient, as known in the art, to obtain piezoelectric properties. Poling is not required for antiferroelectric elements (as an example for this discussion element 82). After poling (only for piezoelectric elements), the electric property, such as dielectric property, of the elements is measured (step 66 of FIG. 2) to identify if the piezoelectric or antiferroelectric elements meet expected quality criteria.

Figure 9:
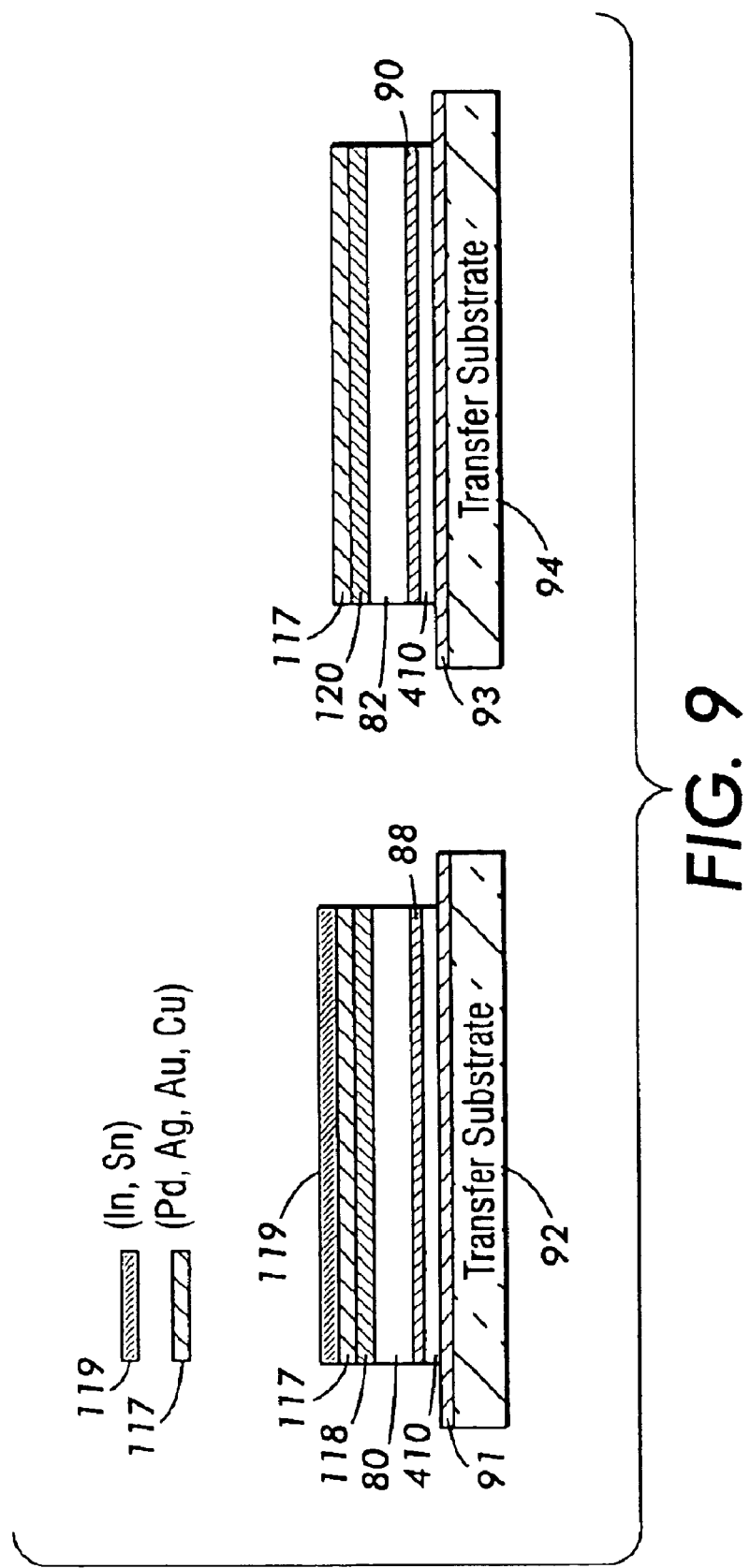
FIG. 9 shows the pair arrangement wherein other thin film metals deposited for bonding after the second electrode deposition.

As the bonding between the two elements is intended to be permanent, a thin film intermetallic transient liquid phase bonding process, which will be described in greater detail later on, could also be used to bond the two elements together, and certain low/high melting-point metal thin film layers may be used as the electrodes for the elements, thus in some cases it is not necessary to deposit the extra electrode layer such as Cr/Ni. However, preferably the thin film intermetallic transient liquid phase bonding process is undertaken after metal electrode deposition, such as Cr/Ni deposition. As shown in FIG. 9, in order to do the thin film intermetallic transient liquid phase bonding, after electrode deposition, poling and electric property measurement, a thin film layer of high melting-point metal 117 (such as silver (Ag), gold (Au), Copper (Cu), Palladium (Pd)) and a thin film layer of low melting-point metal 119 (such as Indium (In), Tin (Sn)) may be deposited on one of the elements (such as the element 80) and a thin layer of high melting-point metal (such as Ag, Au, Cu, Pd) maybe deposited on the other element (such as the element 82). These materials are then used to form a bond. Also a multilayer structure with alternating low melting-point metal/high melting-point metal thin film layers can be used. The poling and dielectric measurement can also be done after depositing these low or high melting-point metal layers.

Following the process of FIG. 2, a variety of bimorph structures may be obtained. The film thickness of the elements of these devices could be between 1 to 100 $\mu$m, or greater. The shape of the bimorph cantilever arms from the top view could be rectangular (with large length to width ratios), tapered rectangular, having a sharp end, or others. The shape of the elements for the bimorph diaphragm can be rectangular, square, circular or other geometric design. The substrate could be silicon, metal, and plastic.

Next, in step 68 the process acts to bond the first element structure to the second element structure, to form a bimorph. The bonding layer between the two elements is desired to be thin (such as thin as 1 $\mu$m or less) and high strength in order to minimize or avoid unexpected mechanical damping or absorption of the bonding layer and not to impose a significant effect on the bimorph performance. This bonding layer will also permit maintaining of electrical contact between the metal electrodes on the two element structures. Compared to the bimorphs made by depositing thin or thick piezoelectric films on both sides of a thick metal plate or foil with the thickness at several tens of micrometers—which are actually "triple layer" bimorph structures—these bimorphs are made by bonding two elements together by a very thin layer can be considered as having a "real" bimorph structure and the two film elements can be considered as directly bonded together.

A number of bonding techniques may be employed to bond the two element structures together. One of the bonding methods is the thin epoxy bonding containing sub-µm conductive balls, which has been described previously and is the same as the bonding layer 95 containing conductive balls 96 shown in FIG. 5A. Another one of the bonding method is the thin epoxy bonding with controlled suitable surface roughness, which has been also described previously and is the same as the bonding layer 95 shown in FIGS. 5B and 5C. For this bonding method the surface roughness is expected to be controlled in a range of about 0.5 to 5 µm, which may be obtained via a rough tape polishing technique, sandblasting, or other known method for achieving a defined surface roughness, after the liftoff has been done but before electrode deposition. The particular surface roughness will be a small fraction of the overall thickness of the elements. The specific roughness being selected in accordance with a particular implementation.

The third one of the described bonding methods is the thin film intermetallic transient liquid phase metal bonding. For this bonding method, as shown in FIG. 9, a high melting-point metal/low melting-point metal thin layer structure has been deposited on the surface of one element and a high melting-point metal thin layer has been deposited on the surface of the other element. Next the two elements are moved into contact and heated under pressure above the melting point of the low melting-point metal, e.g., about 200° C. By this operation the high melting-point metal/low melting-point metal/high melting-point metal combination, such as Pd/In/Pd layer will form a high melting-point metal-low melting-point metal intermetallic compound or alloy, such as $PdIn_3$, which bonds the two element structures together. Functionally, the low melting-point metal diffuses into the high melting-point metal to form the compound or alloy.

As the melting point of the formed intermetallic compound phase can be much higher than that of the low melting-point metal, the working temperature of the bonding layer can be much higher than the temperature used to form the bonding. For example, when Indium (In) is used as the low melting-point metal and Palladium (Pd) used as the high melting-point metal, the bonding can be finished below or at 200° C. as the melting point of In is about 156° C. However, the working temperature of the formed intermetallic compound bonding layer, $PdIn_3$, can be well above 200° C. because the melting point of $PdIn_3$ is about 664° C. The thickness of the bonding layer could be from 1 to 10 µm, but a thinner bonding layer (e.g., about 1 µm or less) is expected for this purpose. Further, the amount of high and low melting-point metals can be controlled so they will be totally consumed to form the intermetallic bonding layer. This described method may be undertaken using smooth surfaces, without a roughening of the surface.

As described, various bonding methods may be used to bond the two element structures, including thin epoxy bonding containing sub-µm conductive balls, thin epoxy bonding with controlled surface roughness, and thin film intermetallic transient liquid phase bonding. Again for simplification in the following drawings and descriptions the bonding between the two elements is designated as a bonding layer 420. It is to be appreciated that the bonding layer 420 should be understood as various ones of the bonding methods described.

Up to this point in the discussion, the elements have been recited as elements 80, 82. In the following discussion, differently-numbered element structures are shown to address examples of different types of bimorph's which can be manufactured by the disclosed process.

Figure 12:
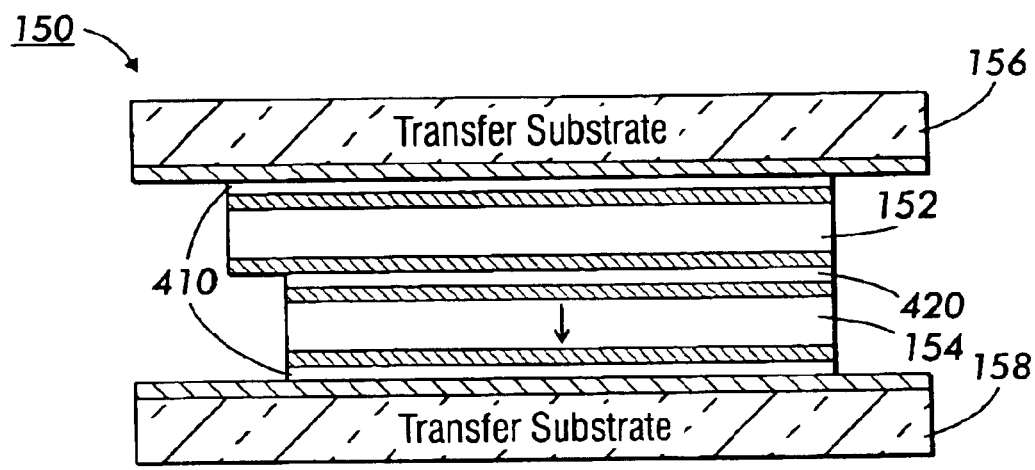
FIG. 12 illustrates a further embodiment where an antiferroelectric element and a piezoelectric element are bonded together.
Figure 13:
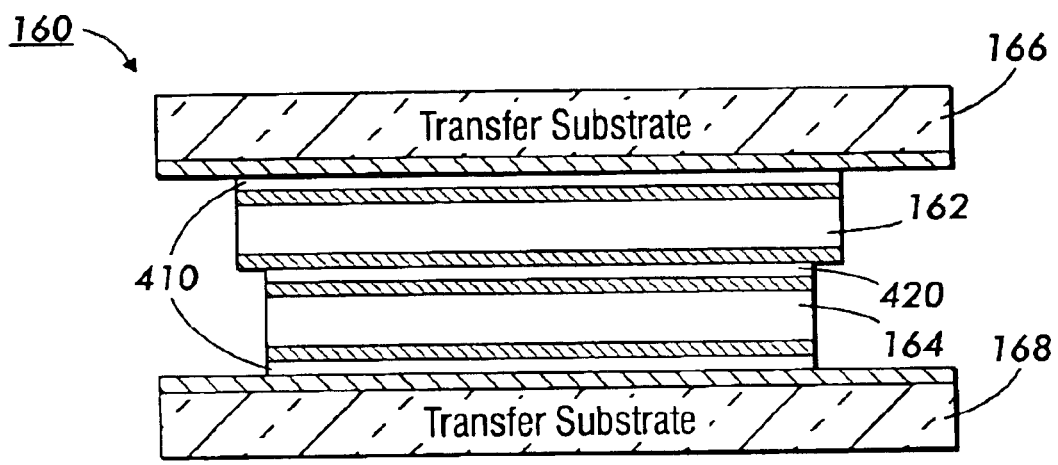
FIG. 13 depicts yet another embodiment where two antiferroelectric film elements are bonded together.

In FIG. 10, when the formed bimorph 130 is two piezoelectric elements 132, 134, poled in opposite directions, they will be in a series connection between transfer substrates 136, 138 and bonded by layer 420. When a bimorph 140, as in FIG. 11, includes piezoelectric elements 142, 144 poled in the same direction, they are in a parallel connection between transfer substrates 146, 148 and bonded by layer 420. For this parallel connection, the electrical connection needs to be applied between the intermediate electrodes and the top/bottom electrodes of the elements. In order to get electrical connection to the intermediate electrodes one element has slightly different dimension to the other or there is a small notch or cutout on the edge of one element at an appropriate location. FIG. 12 is a bimorph 150 with an antiferroelectric element 152 and a poled piezoelectric element 154 between transfer substrates 156, 158. For this type of bimorph the electrical connection also needs to be applied to the intermediate electrodes and again this can be realized by making one element have a slightly different dimension to the other or making a small notch or cutout on the edge of one element at an appropriate location. FIG. 13 illustrates a bimorph 160 with two antiferroelectric elements 162, 164 having no poled direction, and between transfer substrates 166, 168. For this type of bimorph the electrical connection also needs to be applied to the intermediate electrodes and again this can be realized by making one element have slightly different dimension to the other or making a small notch or cutout on the edge of one element at an appropriate location.

FIGS. 14, 15, 16, and 17 illustrate one of the elements released from one of the transfer substrates of arrangements of FIGS. 10, 11, 12 and 13, respectively. These surfaces are cleaned off of residual epoxy or other residuals as called for in step 70 of FIG. 2. For the case where the elements are bonded to the transfer substrate using removable conductive epoxy, such as a tape, after permanent bonding of the two elements is achieved, the tape and the transfer substrate can be easily peeled off from the thick film elements. The present process makes it even easier to take off the conductive tape, since the conductive tape uses filled acrylic, such as the 3M 9712,9713 and 9719 conductive tapes, which lose most of their adhesion after being heated at a temperature of between 150 and 200° C. This level of heat may be applied during the process to bond the two elements together. If not, the transfer substrate to be removed can be heated to about 150 to 200° C. or other appropriate temperature causing the removable conductive tape to lose of its adhesion. Adhesion of the tape may be further reduced by putting the sample in a solvent such as acetone.

For the case where the elements are bonded to the ITO coated glass using the thin nonconductive epoxy (containing or without containing sub-µm conductive balls), the elements can be released from the ITO coated glass by using a liftoff operation in a manner similar as in step 60 of FIG. 2, where the radiation source is a laser. This is possible because the epoxy will also absorb the excimer laser beam, thus the excimer laser exposure will burn off the epoxy and release the element from the glass substrate. As the melting point of epoxy is much lower than that of the metal and ITO electrodes, the laser exposure intensity can be controlled so that it will only burn off the epoxy and not cause any damage on the electrodes After removing the transfer substrate, solvent such as acetone or other appropriate substance may be used to clean off the residual of the conductive tape, the sub-µm conductive balls, or the epoxy.

Figure 18:
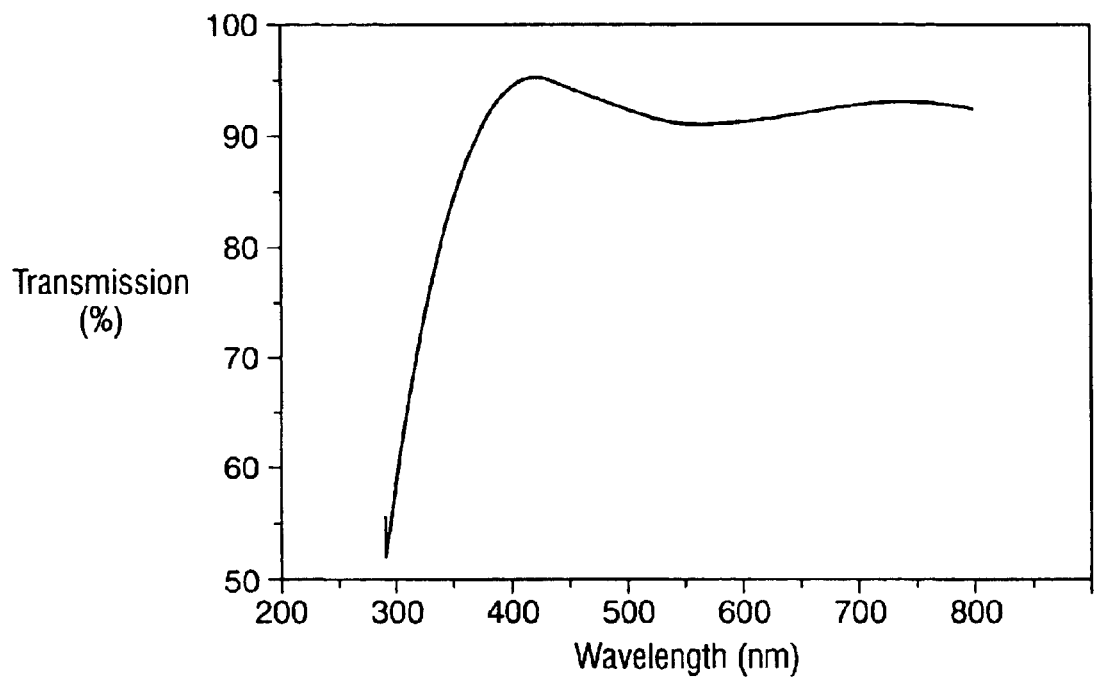
FIG. 18 is a chart depicting light transmission on an ITO layered glass.

It should be noted that when using the liftoff technique to release the elements from ITO-coated glass, in one embodiment an excimer laser with relatively longer wavelength, such as Nd:YAG laser ($\lambda$=355 nm) and XeF ($\lambda$=351 nm)

maybe used. This is because, as shown in FIG. 18, the transmission of light through ITO on glass will drop sharply around λ=300 nm, but around λ=350 nm the transmission can be about 80%. With such high transmission, the laser exposure can be controlled so that only the epoxy is destroyed and damage to the ITO and metal electrodes does not occur.

Figure 14:
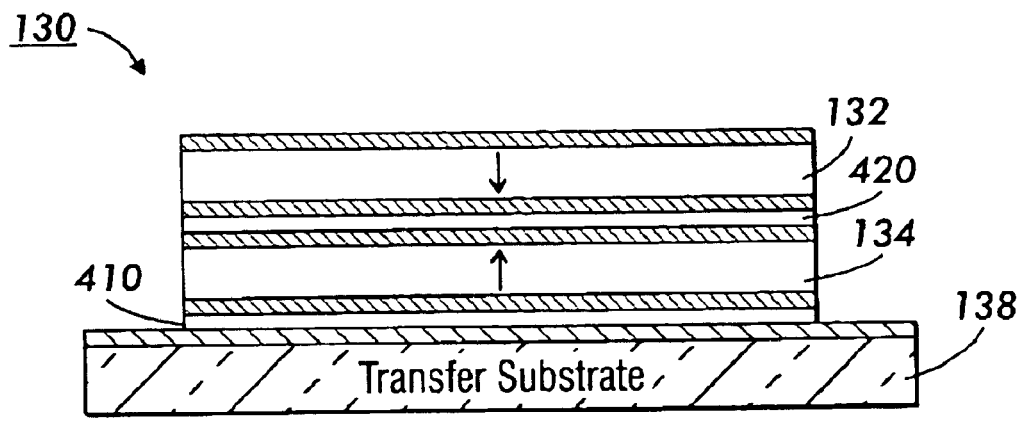
FIG. 14 illustrates the arrangement of FIG. 10 with a top transfer substrate removed.
Figure 15:
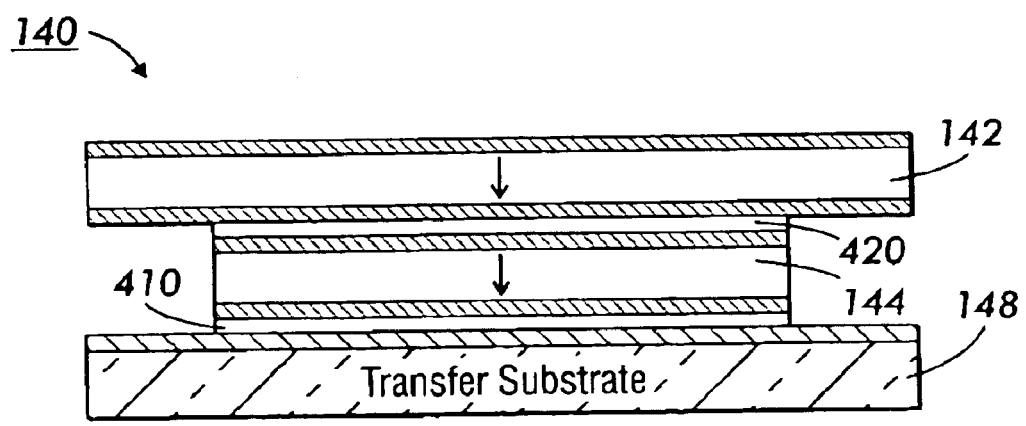
FIG. 15 depicts the arrangement of FIG. 11 with a top transfer substrate removed.
Figure 16:
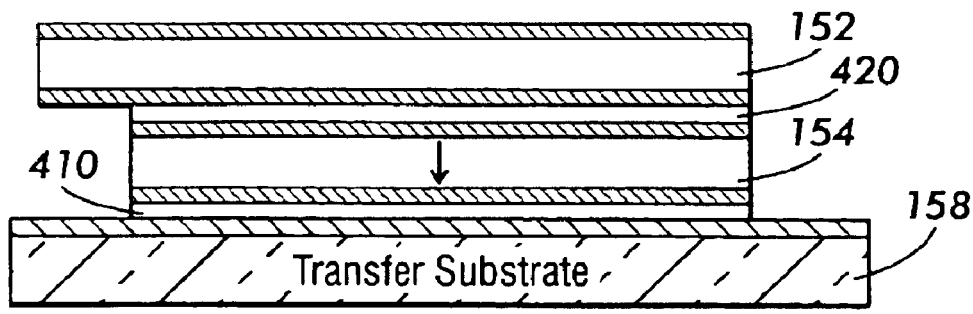
FIG. 16 depicts the arrangement of FIG. 12 with a top transfer substrate removed.
Figure 17:
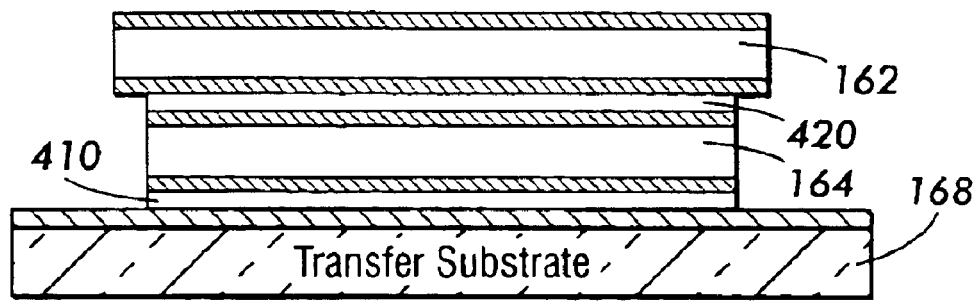
FIG. 17 depicts arrangement of FIG. 13 with a top transfer substrate removed.
Figure 19:
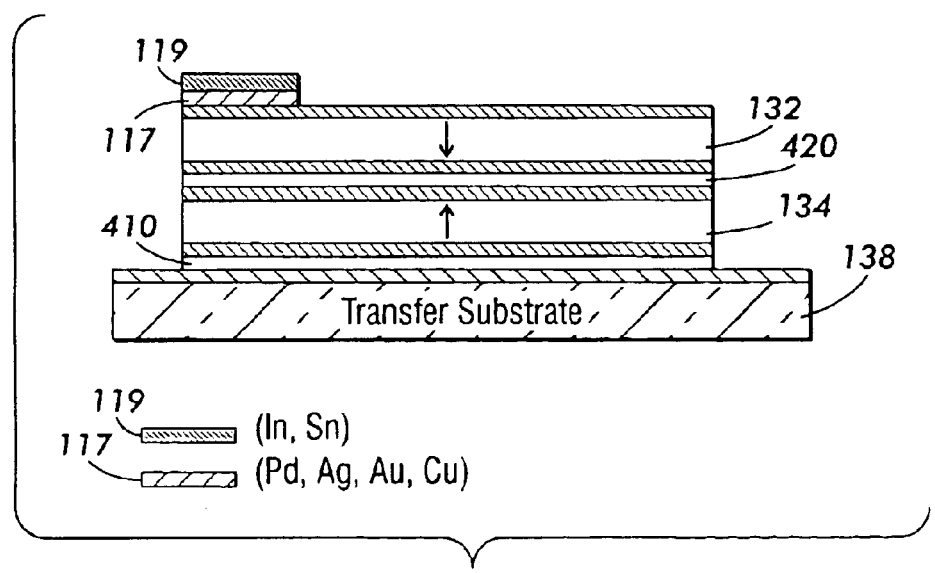
FIG. 19 depicts other thin film metals deposited for bonding on the arrangement of FIG. 14.
Figure 20:
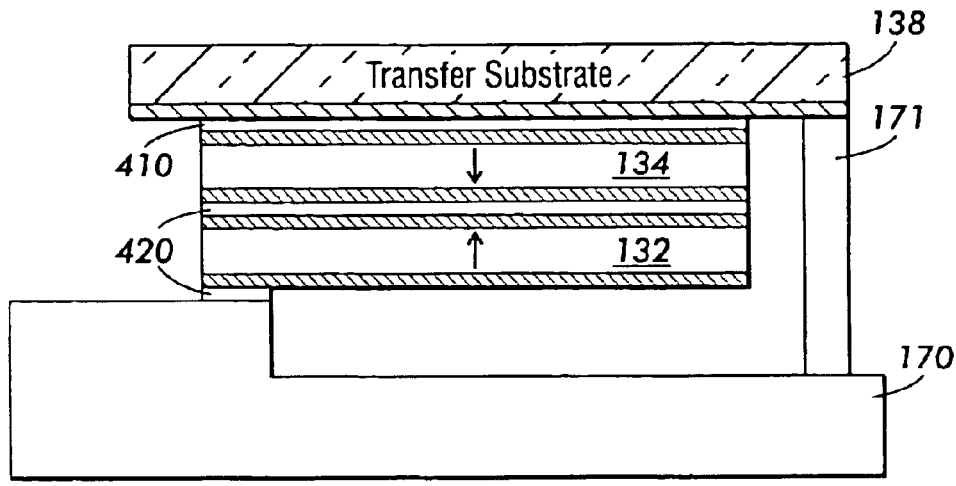
FIG. 20 depicts a piezoelectric bimorph structure with series connected elements attached to a substrate which will be used to form a cantilever device.
Figure 21:
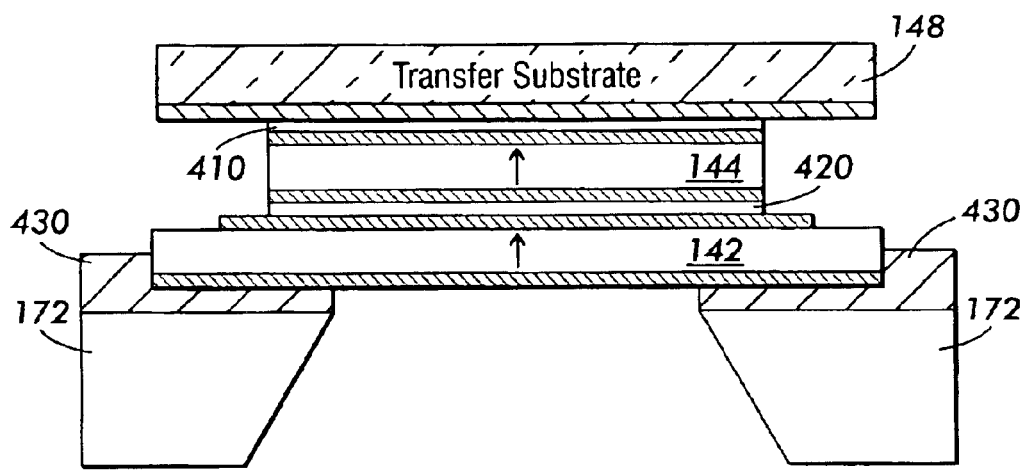
FIG. 21 depicts a piezoelectric bimorph structure with piezoelectric elements bonded in parallel attached to a substrate which will be used to form a diaphragm device.
Figure 22:
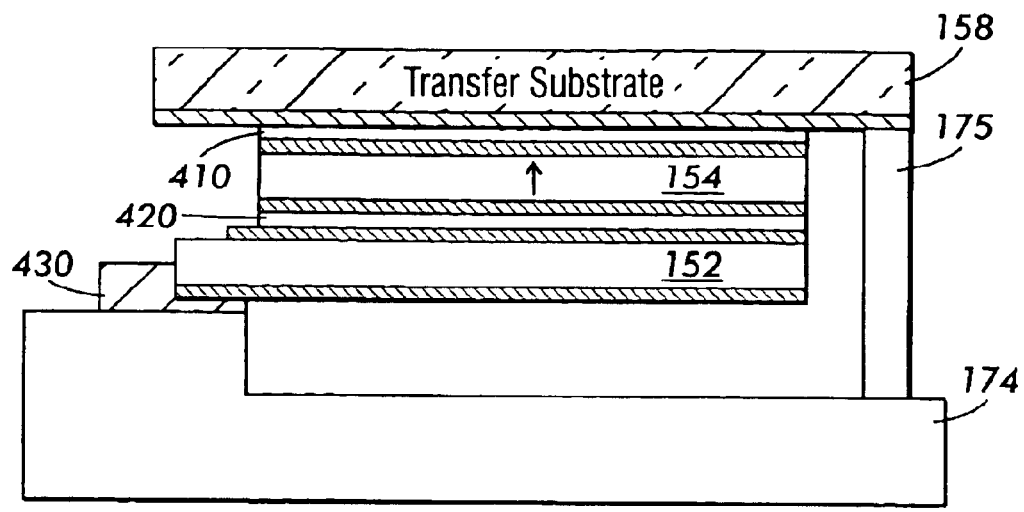
FIG. 22 depicts a piezoelectric/antiferroelectric bimorph structure attached to a substrate which will be used to form a cantilever device.
Figure 23:
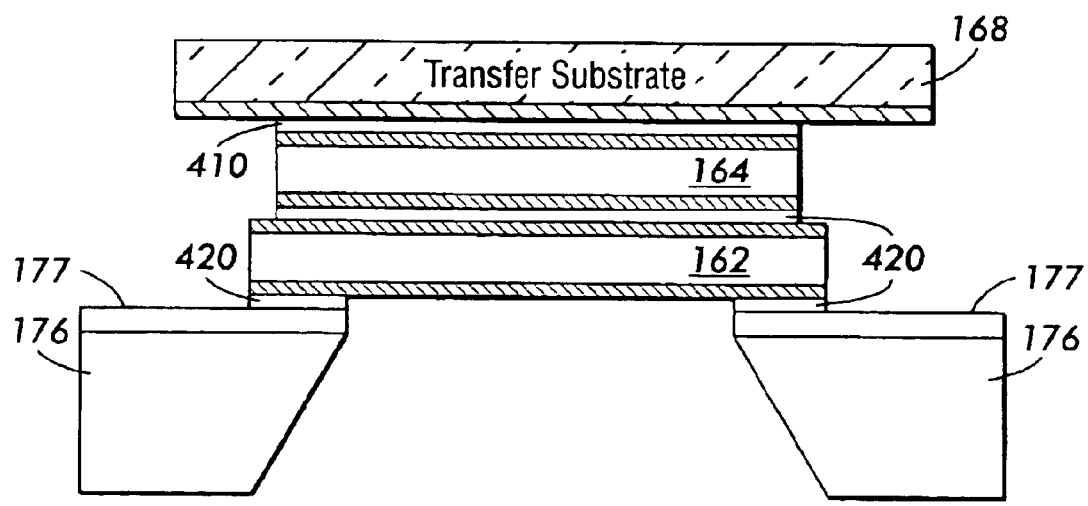
FIG. 23 depicts an antiferroelectric/antiferroelectric bimorph structure attached to a substrate which will be used to form a diaphragm device.
Figure 24:
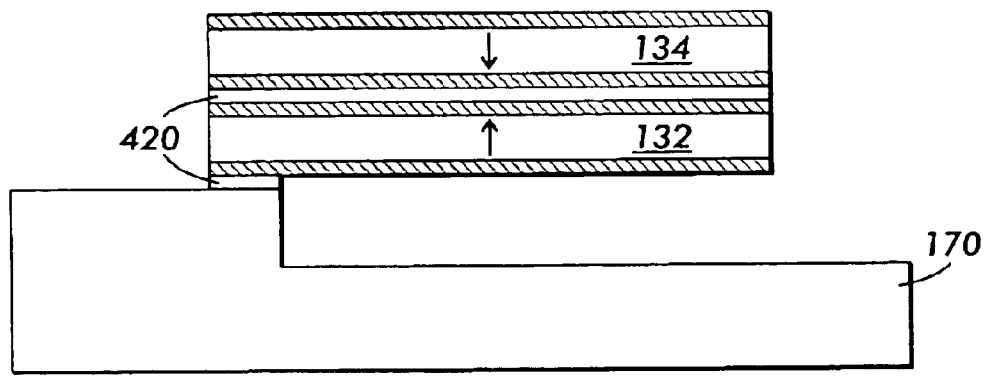
FIG. 24 shows the arrangement of FIG. 20 with the top transfer substrate and support element removed to form a cantilever device.
Figure 25:
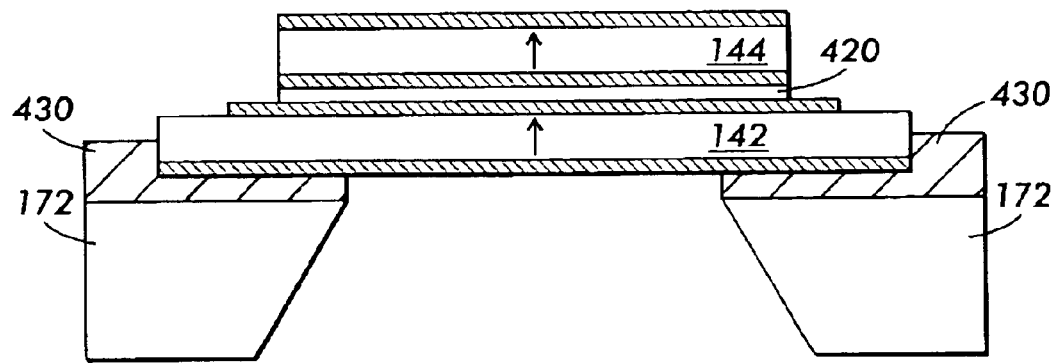
FIG. 25 depicts the arrangement of FIG. 21 with the remaining transfer substrate removed for the formation of a diaphragm device.
Figure 26:
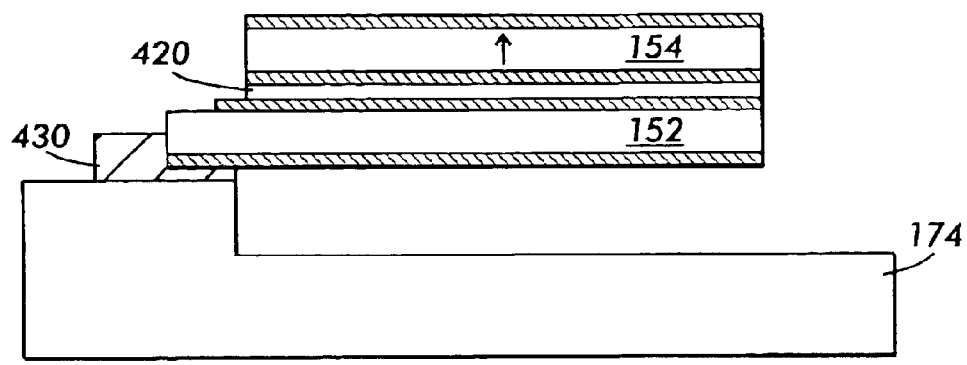
FIG. 26 illustrates the arrangement of FIG. 22 with the remaining transfer substrate and support element removed for a bimorph cantilever device.
Figure 27:
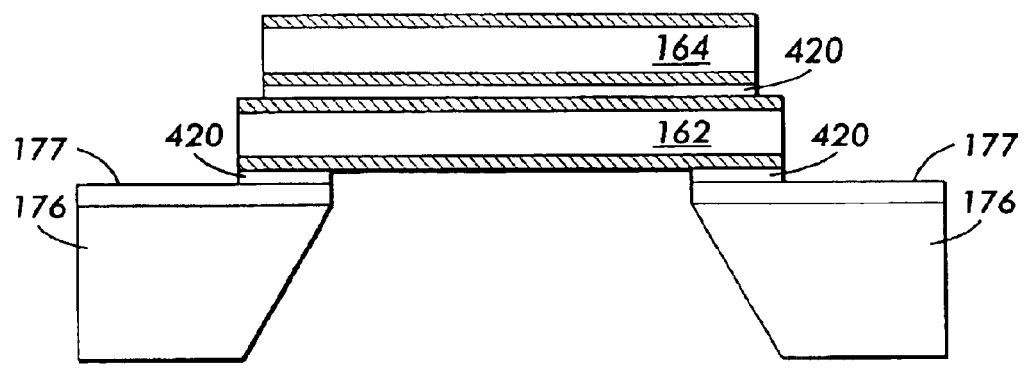
FIG. 27 shows the arrangement of FIG. 23 with the remaining transfer substrate removed for formation of a diaphragm device.

FIG. 19 depicts other thin film metals deposited on some area of the element 132 for bonding to the final target substrate using thin film intermetallic transient liquid phase bonding, on a structure such as depicted in FIG. 14, after the element 132 is released from the transfer substrate. The materials may include a layer of high melting-point metal such as Pd, Ag, Au, Cu or other appropriate material, and a layer of low melting-point metal such as In, Sn or other appropriate material.

Step 72 of FIG. 2 then calls for bonding to the target substrates 170, 172, 174, 176, as shown in FIGS. 20, 21, 22, and 23. The target substrate may have been patterned by using surface or bulk micromachining or other methods so that cantilever or diaphragm bimorph devices are formed after bonding the arrangements of FIGS. 14, 15, 16, 17. For the cantilever bimorphs of FIGS. 20 and 22, one end of the arrangement includes support elements 171, 175 to keep the structure in balance.

Again a number of bonding techniques may be employed to bond the element to the final target substrate. Also it is not necessary to have the bonding layer very thin because the bonding layer is simply used to bond the end or edge of the element, not the whole body of the element. However, if the final target substrate is nonconductive (such as a plastic), conductive epoxy bonding may be used to provide a path for the bottom electrode to an external electrical circuit. If the final target substrate is conductive or has a surface conductive layer (such as a metal substrate or a metal coated silicon substrate), the bonding between the element and the final target substrate can be realized by using conductive epoxy, thin epoxy bonding with sub-$\mu$m conductive balls, thin epoxy bonding with controlled surface roughness, or thin film intermetallic transient liquid phase bonding.

When the thin film intermetallic transient liquid phase bonding method is to be used, before the bonding, a high melting-point metal (such as Pd, Ag, Au, Cu)/low melting-point metal (such as In, Sn) thin layer structure has to be deposited on the to be bonded area of the surface of the element and a high melting-point metal thin layer (such as Pd, Ag, Au, and Cu) may be deposited on the area of the surface of the substrate to be bonded. Alternatively, a high melting-point metal/low melting-point metal thin layer structure may be deposited on the area of the surface of the substrate to be bonded, and a high melting-point metal thin layer may be deposited on the area of the surface of the element to be bonded. As an example, the embodiment given in FIG. 19 depicts a high melting-point metal/low melting-point metal deposited on one end of the surface of piezoelectric element 132, and this end is to be bonded to the substrate to form a cantilever bimorph device.

FIGS. 20 to 23 are several examples showing how to bond the element to the final target substrate. For the embodiments shown in FIG. 20 and 23, the elements 132 and 162 are respectively bonded to a conductive substrate 170 and a substrate 176 which has a surface conductive layer 177 using one of the previously described bonding methods such as thin epoxy bonding with sub-$\mu$m conductive balls, thin epoxy bonding with controlled surface roughness, or thin film intermetallic transient liquid phase bonding, thus the bonding layer is designated as 420. For the embodiments shown in FIGS. 21 and 22, the elements 142 and 152 are respectively bonded to the nonconductive substrates 172 and 174 using the conductive epoxy 430. Also, to avoid a possible short circuit between the conductive epoxy 430 and the intermediate electrodes of elements 142 and 152, the inner electrodes do not cover the left end of the elements. On the other hand, a bimorph device does not need to have a passive layer. Therefore, the cavities shown in FIGS. 21 and 23 extend through the substrates 172 and 176, that is, a thin layer of substrate material is not on the cavities. This arrangement is quite different from MEMS unimorph diaphragm devices, where a thin layer of substrate material (working as a passive diaphragm) is necessary on the top of the cavities.

Next, in step 74 of FIG. 2, and as shown in FIGS. 24, 25, 26 and 27, the element is released from the other transfer substrate and residual epoxy or other residual substances are cleaned off. For the arrangements of FIGS. 24 and 26, support elements 171, 175 are removed. Then, similar to step 70, the transfer substrate can be released by using a liftoff technique or by mechanically peeling off the transfer substrate, depending on the nature of the bonding layer 410.

As recited in step 76 of FIG. 2, once the described arrangements have been manufactured, electrical connections may be made, where necessary, to permit the arrangements to receive power or to deliver a signal. A more detailed discussion of this step will be discussed herein.

FIGS. 28–33 illustrate a number of alternative designs where a bimorph structure is connected to a substrate to permit support of the structure, as well as electrical contact to external circuits 179 for driving by a power source or for delivering a signal.

For these FIGURES, in cases where bonding layer between the end of the bimorph arrangement and the substrate is conductive epoxy, the lower surface electrode of the element can be connected to an external electric circuit through the conductive epoxy bonding layer if the bimorphs are bonded to a nonconductive substrate such as plastic, or the lower surface electrode of the bottom element is connected to the substrate through the conductive epoxy if the surface of the substrate is conductive, such as metal substrate or metalized silicon substrate. The intermediate surface electrodes of the two elements and the top surface electrode of the top element should not cover the end to be bonded in order to avoid the possible short circuit problem. This short circuit problem would not exist when using thin epoxy bonding containing sub-$\mu$m conductive balls, thin epoxy bonding with controlled surface roughness, or thin film intermetallic transient liquid phase bonding to bond the element to a conductive substrate or a substrate having a conductive surface layer. Again, the bonding layer is designated as 420 if one of these bonding methods is used. Therefore, the intermediate electrodes of the two elements and the top surface electrode of the top element can cover the whole surface, and the lower surface electrode of the bottom element will be connected to an external circuit through the surface of the substrate and the bonding layer.

In FIGS. 28–33, the numbered element structures are intended to represent the alternative bimorph arrangements including piezoelectric/piezoelectric, antiferroelectric/piezoelectric, and antiferroelectric/antiferroelectric structures. Particularly identified in these FIGURES are whether bonding is occurring to a conductive or nonconductive substrate. For example in FIG. 28A, illustrated is a cantilever arrangement 188 where the two piezoelectric elements 190 and 192 are in a series connection and are bonded to a nonconductive substrate 184 using a conductive epoxy 430. Connections to the external circuit 179 are through the electrical contact 194 which is found on the top surface of element 190, and electrical contact 198 which is connected to the bottom electrode of element 192 through the conductive epoxy 430. For this bimorph (in a series connection) it is not necessary to have an electrical contact to the intermediate electrodes of the two elements. The intermediate electrodes of the two elements 190 and 192 and the top electrode of the element 190 do not cover the left ends, in order to avoid a possible short circuit problem when the thickness of the elements are relatively thin and the conductive epoxy bonding layer is relatively thick.

Figure 28A:
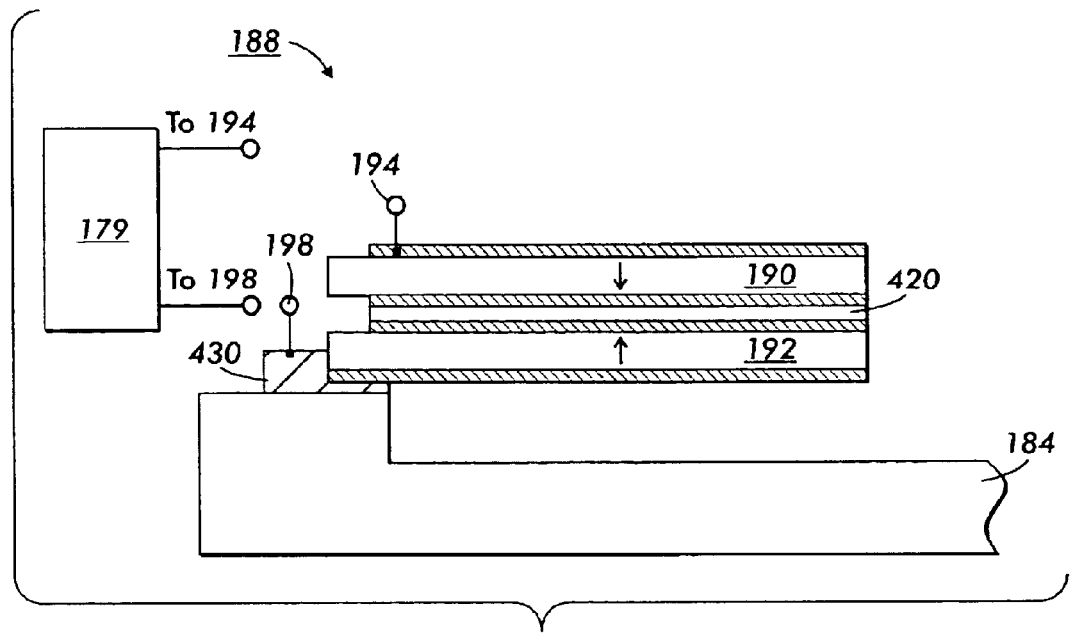
FIG. 28A shows a cantilever design where the series connected piezoelectric bimorph is bonded to a nonconductive substrate using conductive epoxy.
Figure 28B:
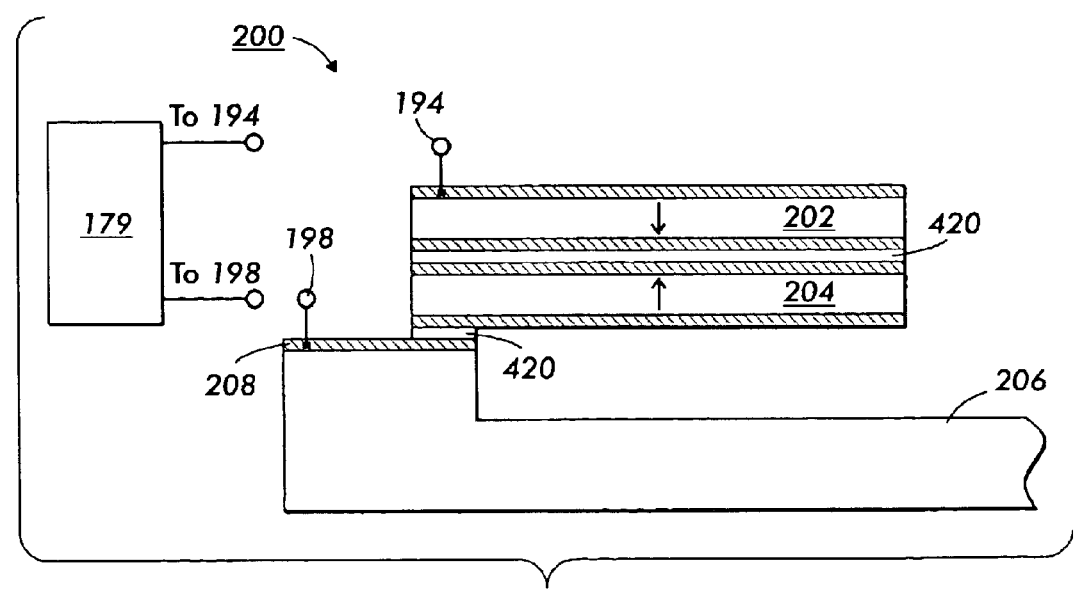
FIG. 28B shows the bimorph bonded to a substrate with a surface conductive layer using a thin layer bonding which can maintain electric contact.

FIG. 28B depicts a cantilever arrangement 200 where the two piezoelectric elements 202 and 204 are in a series connection and are bonded to a substrate 206 which has a surface conductive layer 208 using the thin bonding layer 420. The layer 420 is a layer which is able to maintain electric contact between the bottom electrode of element 204 and conductive layer 208. It is also possible that substrate 206 is conductive thus it is not necessary to have a separate surface conductive layer 208. Connections to the external circuit 179 are through the electrical contacts 194 which is found on the top surface of element 190, and electrical contact 198 which is connected to the bottom electrode of element 192 through the thin bonding layer 420.

Figure 29A:
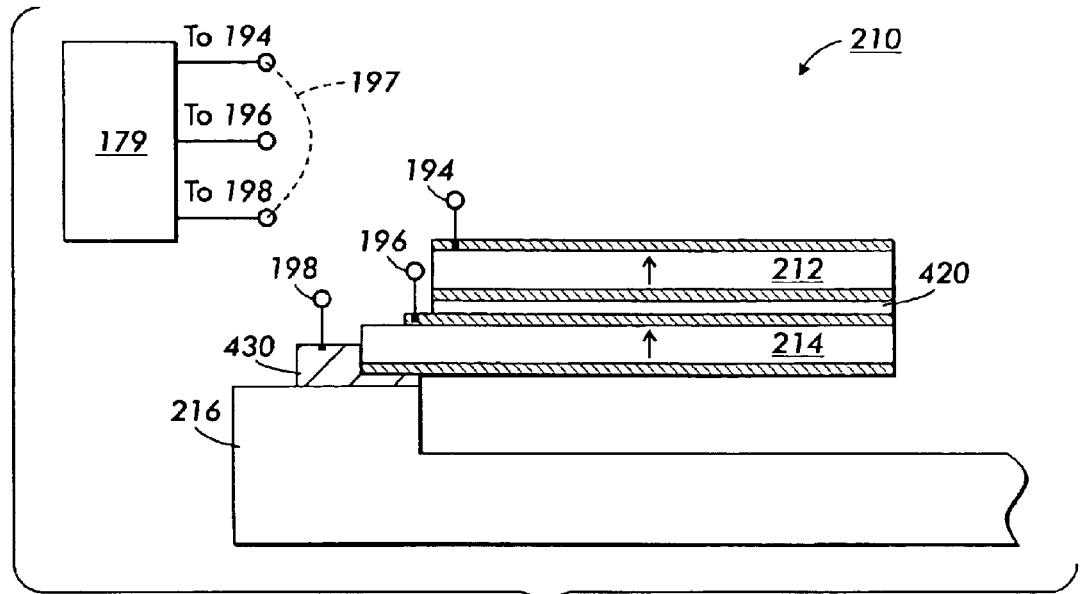
FIG. 29A depicts a cantilever design where the parallel connected piezoelectric bimorph structure is bonded to a nonconductive surface using a conductive epoxy.

FIG. 29A depicts a cantilever arrangement 210 where two piezoelectric elements 212 and 214 are in a parallel connection and are bonded to a nonconductive substrate 216 using a conductive epoxy 430. Connections to the external circuit 179 are through the electrical contact 194 which is on the top surface of element 212, electrical contact 196 which is on the top surface of element 214 and electrical contact 198 which is connected to the bottom electrode of element 214 (through the conductive epoxy). For this bimorph in a parallel connection the two elements 212 and 214 are driven simultaneously, thus the electrical contacts 194 and 198 can be connected together, which is represented by the dotted line 197.

Figure 29B:
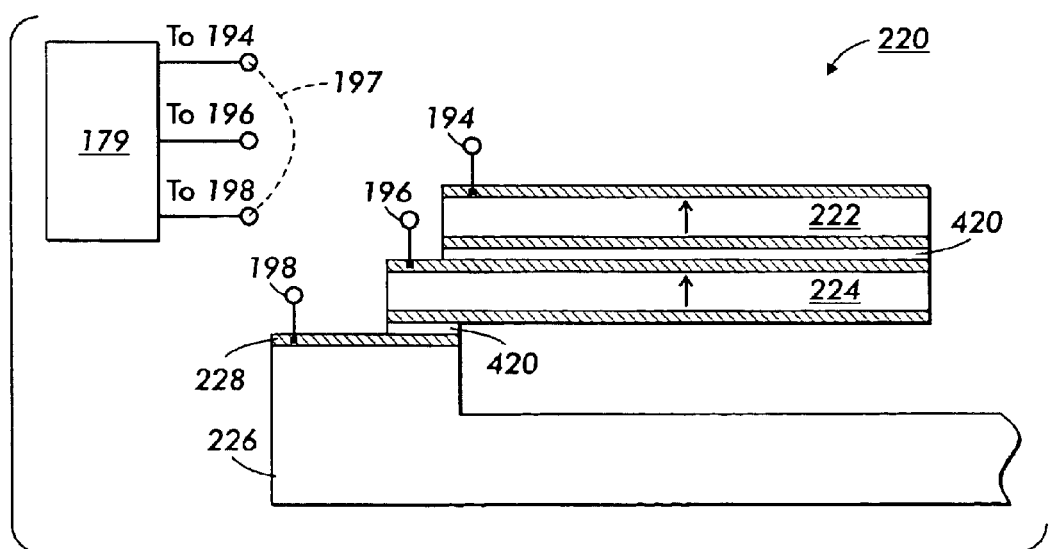
FIG. 29B shows the bimorph bonded to a conductive surface using a thin layer bonding which can maintain electric contact.

FIG. 29B depicts a cantilever arrangement 220 where the two piezoelectric elements 222 and 224 are in a parallel connection and are bonded to a substrate 226 which has a surface conductive layer 228 using thin bonding layer 420 which can maintain electric contact between the bottom electrode of the element 224 and the conductive layer 228. It is also possible that the substrate 226 is conductive thus it would not be necessary to have a separate surface conductive layer 228. Connections to the external circuit 179 are through electrical contact 194 which is on the top surface of element 222, electrical contact 196 which is on the top surface of element 224, and electrical contact 198 which is connected to the bottom electrode of element 224 through the thin bonding layer 420. Again electrical contacts 194 and 198 can be connected together.

Figure 30:
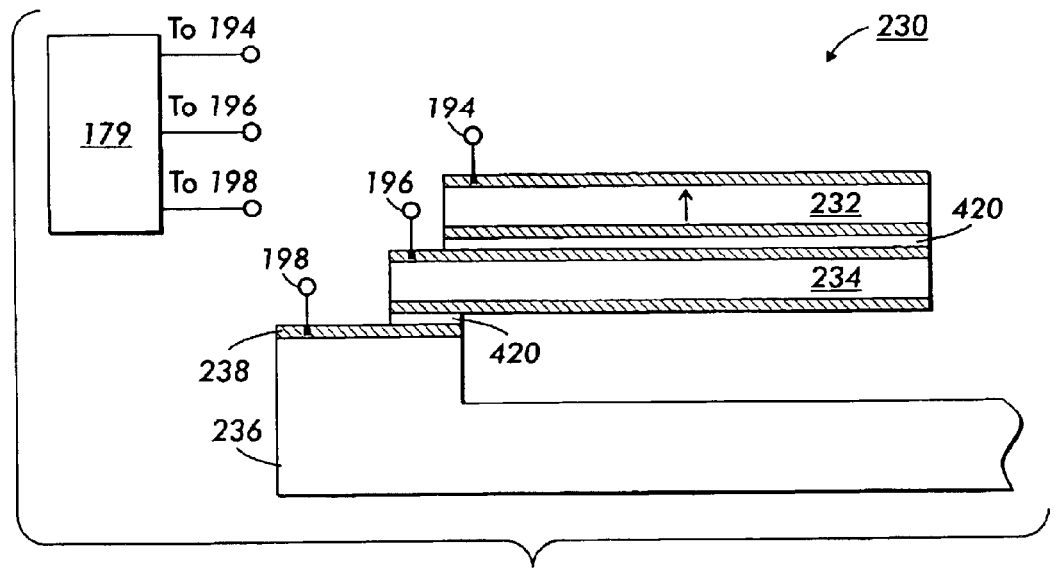
FIG. 30 depicts a cantilever design where the piezoelectric/-antiferroelectric bimorph is bonded to a conductive surface using a thin layer bonding which can maintain electric contact.
Figure 31:
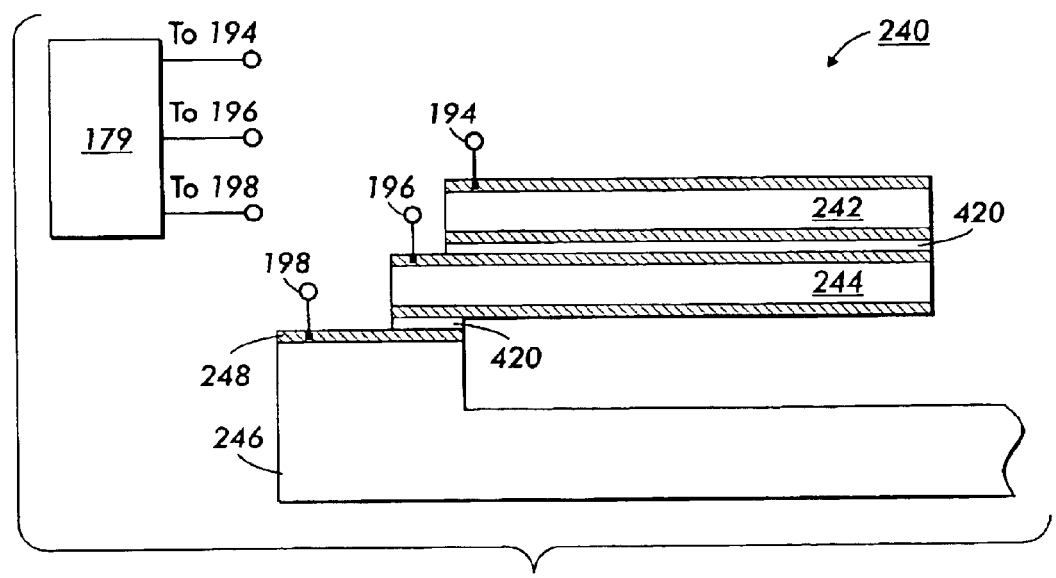
FIG. 31 depicts a cantilever design where the antiferroelectric bimorph is bonded to a conductive surface using a thin layer bonding which can maintain electric contact.

The arrangements of antiferroelectric/piezoelectric and antiferroelectric/antiferroelectric bimorphs of FIGS. 30 and 31 will be very similar to that of the parallel bimorphs shown in FIGS. 29A and 29B. However, as for the antiferroelectric/piezoelectric and antiferroelectric/antiferroelectric bimorphs the two elements need to be driven separately, therefore the electrical contacts 194 and 198 are not connected together. As an example, one antiferroelectric/piezoelectric bimorph which is bonded to a substrate 236 with a surface conductive layer 238 is given in FIG. 30. One antiferroelectric/antiferroelectric bimorph which is bonded to a substrate 246 with a surface conductive layer 248 is given in FIG. 31.

Substrates 236 and 246 can also be conductive where they do not need to have a separate surface conductive layer. The element 232 (FIG. 30) maybe made from a piezoelectric material, and elements 234, 242 and 244 (FIGS. 30, 31) may be considered to be made from an antiferroelectric material.

Figure 32:
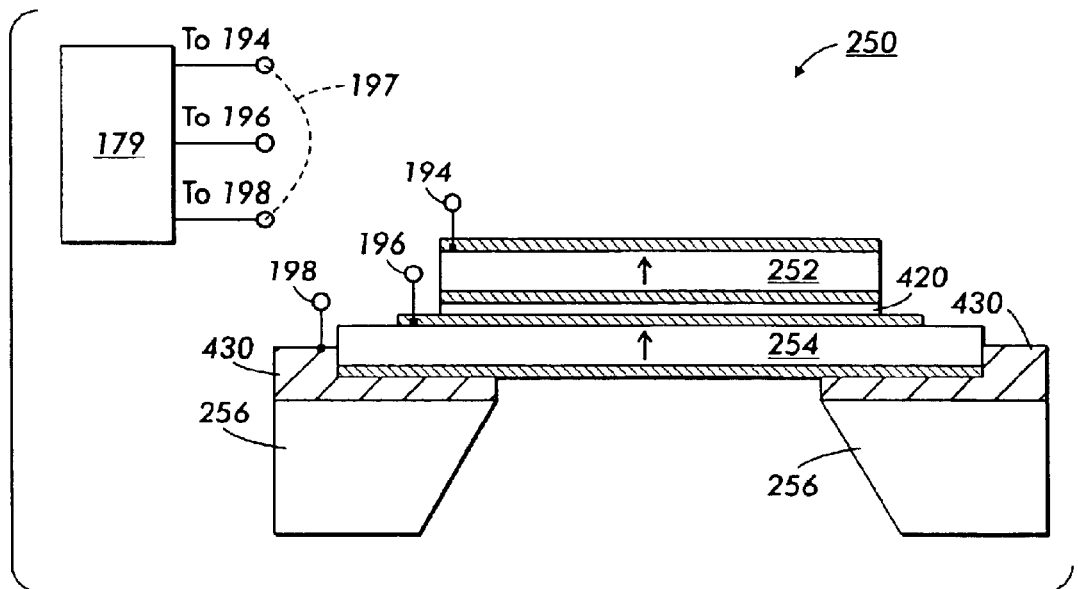
FIG. 32 illustrates a diaphragm arrangement where the parallel connected piezoelectric bimorph structure is bonded to a nonconductive substrate.
Figure 33:
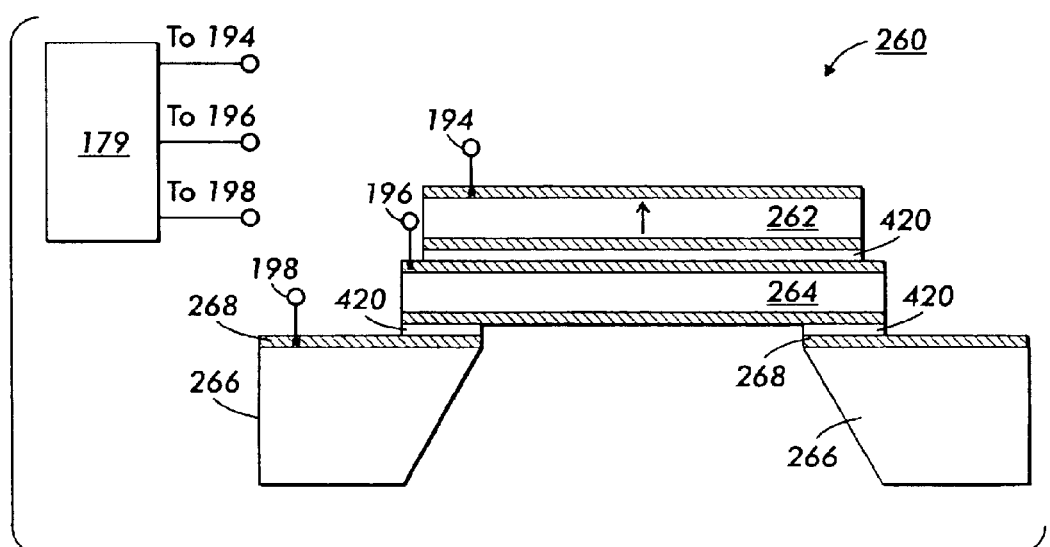
FIG. 33 depicts a diaphragm device where the piezoelectric/-antiferroelectric bimorph structure is bonded to a conductive surface.

In addition to the cantilever bimorph devices described above, diaphragm bimorph devices can also be fabricated, with the similar arrangements of the elements and bonding methods between the elements and substrates as the cantilever bimorph devices shown in FIGS. 28 to 31. Two examples of this may be seen in FIGS. 32 and 33. FIG. 32 depicts a piezoelectric/piezoelectric diaphragm bimorph device 250 with an arrangement of elements and bonding method the same as the cantilever bimorph device shown in FIG. 29A. FIG. 33 shows a piezoelectric/antiferroelectric diaphragm bimorph device 260 with an arrangement of elements and bonding method the same as the cantilever device shown in FIG. 30. It is to be appreciated that FIGS. 32 and 33 are simply used as examples for the diaphragm bimorph devices, and diaphragm bimorph devices may be configured using all the alternative designs for cantilever bimorph devices described herein.

Figure 34:
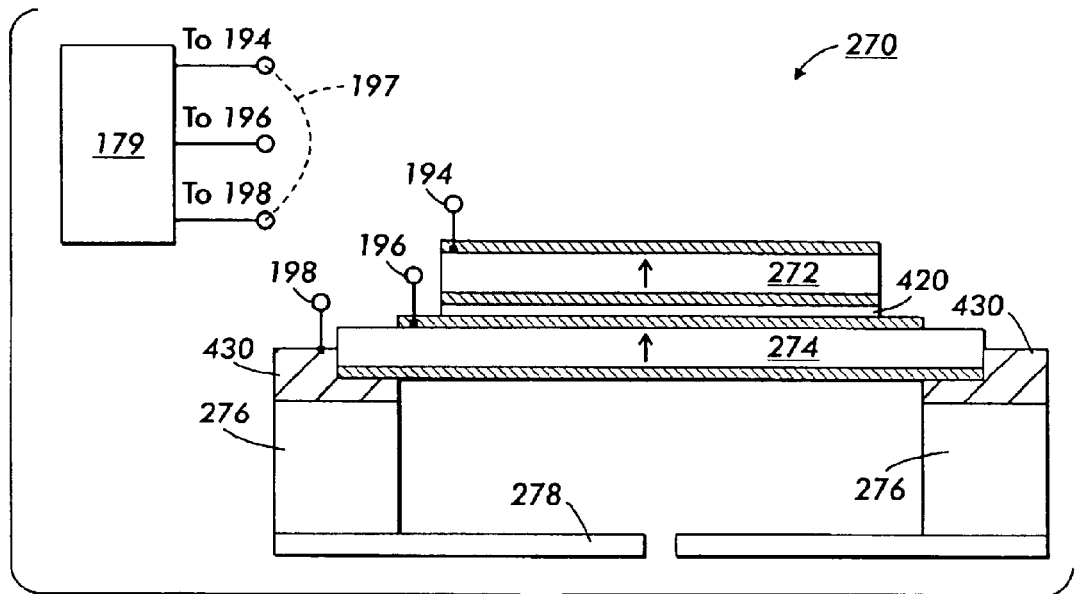
FIG. 34 is an ejector wherein the parallel connected piezoelectric bimorph structure is connected to a nonconductive surface via a conductive epoxy.
Figure 35:
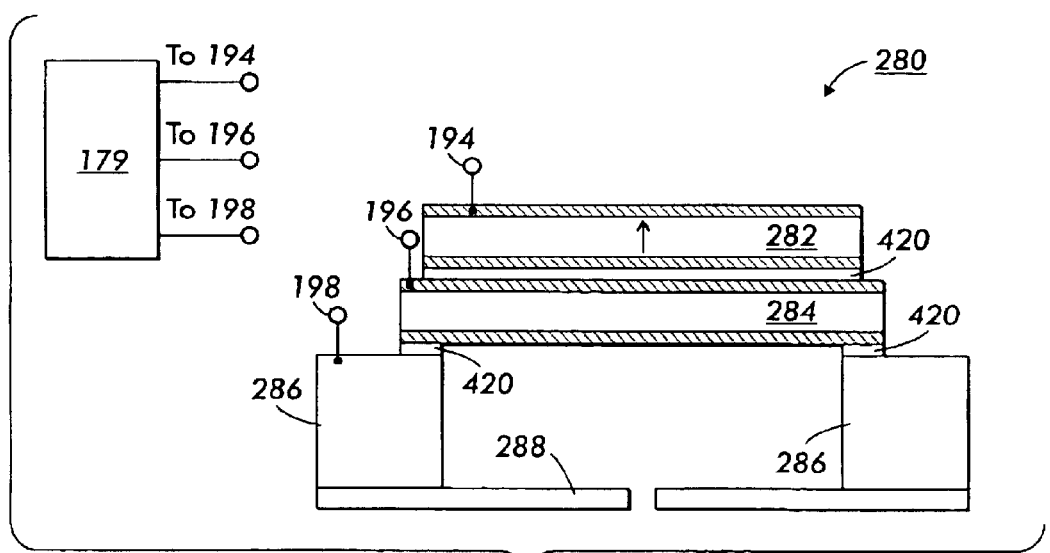
FIG. 35 is an ejector wherein the piezoelectric/antiferroelectric bimorph structure is connected to a conductive surface using a thin layer bonding which can maintain electric contact.
Figure 36:
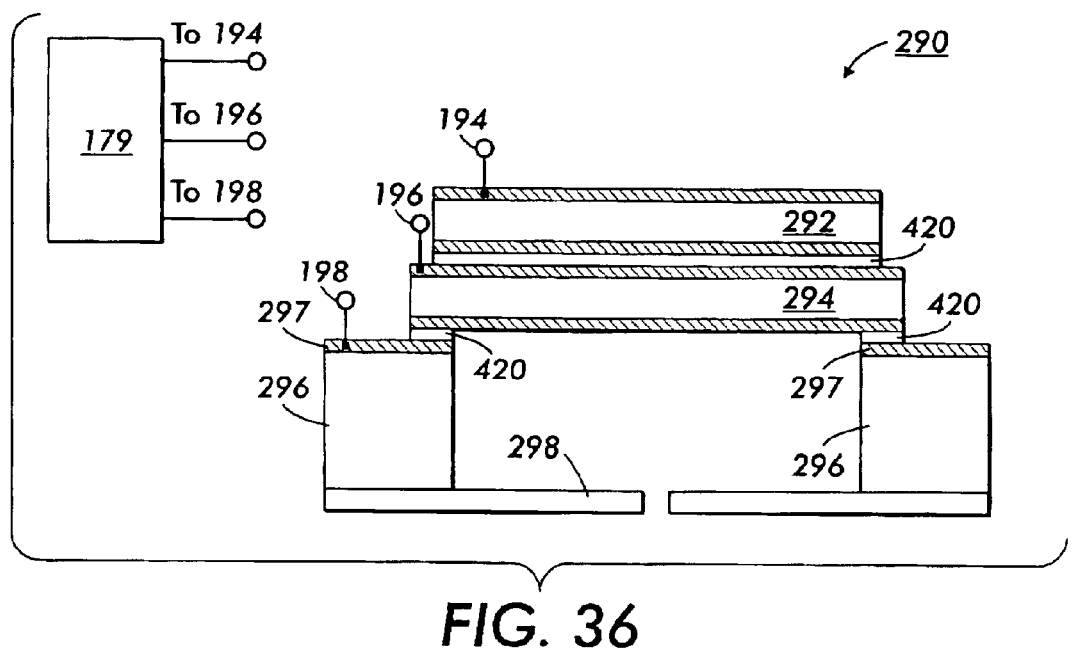
FIG. 36 is an ejector wherein the antiferroelectric bimorph structure is connected to a conductive surface using a thin layer bonding which can maintain electric contact.

Micro-fluid ejectors, such as printheads or pumps, can be constructed by using the MEMS-type piezoelectric/piezoelectric, piezoelectric/antiferroelectric, and antiferroelectric/antiferroelectric diaphragm bimorphs presented in this application. These ejectors, pumps or printheads may be used to emit a variety of fluids, including all types of biofluids, including those with genetic or pharmaceutical materials or other biological materials, as well as a variety of inks. The piezoelectric/piezoelectric bimorphs may be either in a series or a parallel connection, if the elements are bonded to a reservoir (or ink cavity body) with a nozzle plate. The bonding between the elements and the reservoir (ink cavity body)/nozzle plate may be accomplished by use of conductive epoxy, or by the thin bonding layer 420 which maintains electric contact between the bottom electrode of the element and the surface of the reservoir (ink cavity body) when the reservoir (ink cavity body) is conductive. If the reservoir (ink cavity body) is not conductive, conductive epoxy bonding is used. FIGS. 34, 35 and 36 illustrate examples of the above-described concepts.

FIG. 34 shows an embodiment of a fluid ejector 270, such as a printhead, using a piezoelectric/piezoelectric diaphragm bimorph in a parallel connection bonded to a non-conductive reservoir (ink cavity body) 276/nozzle plate 278 using the conductive epoxy 430. FIG. 35 illustrates a fluid ejector 280 using a piezoelectric/antiferroelectric diaphragm bimorph bonded to a conductive reservoir (ink cavity body) 286/nozzle plate 288 using the thin bonding layer 420. FIG. 36 illustrates an embodiment of a fluid ejector 290 using an antiferroelectric /antiferroelectric diaphragm bimorph bonded to a reservoir (ink cavity body) 296/nozzle plate 298 which has a surface conductive layer 297 using the thin bonding layer 420.

As the antiferroelectric materials are uni-directional actuators, that is, the material will always expand under an applied field, in order to generate bi-directional displacement for the bimorph actuators, each of the antiferroelectric and piezoelectric elements in an antiferroelectric/antiferroelectric bimorph or piezoelectric/antiferroelectric bimorph will be driven separately and only one element will be driven at a time. For example, for a bimorph cantilever of FIG. 31, where it is an antiferroelectric/antiferroelectric bimorph cantilever actuator, application of an electric field on the bottom element 244, will cause it to expand (no matter the field direction). At the same time, if no field is applied on the top element 242, the actuator will bend up and generate a tip displacement which goes up. On the other hand, if an electric field is applied on the top element 242, it will expand (no matter the field direction), and if no field is applied on the bottom element 244, the bimorph cantilever actuator will bend down and generate a tip displacement which goes down. For the antiferroelectric/piezoelectric cantilever actuator shown in FIG. 30, if an electric field is applied on the bottom antiferroelectric element 234, it will expand (no matter the field direction), then if no field is applied on the top piezoelectric element 232, the cantilever actuator will bend up and generate a tip displacement along the up direction. On the other hand, if an electric field is applied to the top piezoelectric element 232 and making it expands in the lateral direction (this means the field direction is opposite to the polarization direction), and no field is applied to the bottom antiferroelectric element 234, the cantilever actuator will bend down and generate a tip displacement which goes down.

For the ejectors shown in FIG. 35 or 36, if an electric field is applied to a bottom antiferroelectric element 284 or 294, causing it to expand, and no field is applied to the top piezoelectric element 282 or antiferroelectric element 292, the generated displacement will go down, pushing fluid out of the ejector. On other hand, if an electric field is applied to the top piezoelectric element 282, causing it to expand in the lateral direction (the electric field is opposite to the polarization direction) or applied to the top antiferroelectric element 292, while no electric field is applied to a bottom antiferroelectric element 284 or 294, the generated displacement will go up and draw the fluid into the ejector. Usually, a large displacement is needed to push fluid out and a small displacement to draw the fluid in, an antiferroelectric element with large displacement ability may be used as the bottom element and antiferroelectric element with smaller displacement or piezoelectric element is used as the top element.

The described MEMS-type antiferroelectric/ antiferroelectric, piezoelectric/piezoelectric, or antiferroelectric/piezoelectric thin and thick film bimorphs as described in the foregoing, may replace piezoelectric unimorph actuators which have been used in MEMS devices.

The proposed method to manufacture these bimorph structures may be considered as a clean, low-temperature process for the final target substrate or system. This is true, since the only process for the final target substrate or system is to simply bond the tested good bimorphs to the substrate and perform a removal of a final carrier via a laser liftoff method or other appropriate process. Thus, the described procedure is fully compatible with existing integrated circuit (IC) processes. Experiments which have been undertaken demonstrate the bonding of the structures to a silicon wafer, and performing a laser liftoff process does not destroy a CMOS circuit on the silicon wafer. This is in opposition to existing processes, which implement piezoelectric and/or antiferroelectric films which need to anneal the films at 500 to 700° C. or greater. The requirement of a high melting-point target substrate or system places limitations and obstacles to the integrating of piezoelectric and/or antiferroelectric films with microelectronics on a single chip.

With attention to particular uses for the described bimorphs, a PZT thin film cantilever bimorph in a parallel connection on a silicon substrate may be used in atomic force microscope (AFM) tips. Particularly, it has been reported that the use of PZT thin film cantilever unimorphs may double the resolution of previous AFM tips using ZnO, due to the higher charge sensitivity from the larger piezoelectric effect in the PZT films. By use of the concepts of the present application, a PZT thin film cantilever bimorph in parallel connection can increase the resolution even to a greater degree, as the charge sensitivity of the PZT bimorph in parallel connection is much higher than that of a unimorph.

Additionally, a PZT thin film and thick film cantilever bimorph in a parallel connection on silicon can be used as an integrated accelerometer. As with integrated piezoelectric accelerometers in existence, the induced charge is directly measured, rather than a voltage. Bimorphs in parallel connections can be used to replace the current unimorphs, and thus charge sensitivity can be greatly increased. PZT diaphragm bimorphs provided in a series connection on silicon or stainless steel substrates can be used to replace current unimorphs as acoustic sensors such as sonar transducers.

Further, ejectors, such as ejectors shown in FIGS. 34 to 35, benefit from the increased strain generation of the described bimorph structures. This means that for the same ejector dimension, a much larger droplet can be generated by the ejector using the described bimorphs. Alternatively, droplets possible with the existing system may be generated with much smaller devices.

As these bimorph actuators do not need an extra passive diaphragm layer, and do not require mechanical property (mainly Young's modulus) matching between the element structures and passive diaphragm layer, a very soft reservoir or cavity body material may be used. For example, a plastic cavity body and nozzle plate has been implemented in described designs, which may be made as one piece through injection molding. Further, due to the described process, ejectors/printheads made in accordance with the described process, including plastic cavity body/nozzle plates, may be manufactured inexpensively and, therefore, may be valuable in particular implementations such as bioprinting, for the ejection of biofluids. Furthermore, as many ejectors only need to eject a fixed amount of a droplet and require a fixed displacement of the actuator to draw the fluid from the reservoir, considering the "digital" actuation characteristics of the antiferroelectric material, the systems do not require a highly accurately controllable driving voltage.

While the above descriptions focus on making one bimorph device, it is obvious that many bimorph devices or an array of bimorph devices can be made on a substrate using the same method presented in this invention.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method of producing a bimorph structure or an array of bimorph structures comprising:
    depositing a first material onto a surface of a first substrate to form at least one first element structure;
    depositing a second material onto a surface of a second substrate to form at least one second element structure;
    depositing electrodes on a surface of each of the at least one first element structure and the at least one second element structure;
    bonding the at least one first element structure to a first transfer substrate;
    bonding the at least one second element structure to a second transfer substrate;

removing the first substrate from the first element structure;

removing the second substrate from the second element structure;

depositing second side electrodes on a second surface of each of the at least one first element structure and the at least one second element structure;

bonding the at least one first element structure directly to the at least one second element structure;

removing one of the first transfer substrate and the second transfer substrate;

bonding a surface of the at least one element structure from which one of the first transfer substrate or the second transfer substrate has been removed, to a final target substrate;

removing the other transfer substrate; and adding electrical connections.

2. The method according to claim 1, wherein the at least one first and at least one second element structures are made from antiferroelectric material.

3. The method according to claim 2, wherein the first element structure is connected to a driving circuit, and the second element structure is connected separately to the driving circuit, wherein actuation of the first element structure and the second element structure are independent of each other.

4. The method according to claim 3, wherein the first element structure is driven separately from the second element structure to generate displacement.

5. The method according to claim 1, wherein the at least one first element structure is made from antiferroelectric material and the at least one second element structure is made from piezoelectric material.

6. The method according to claim 1, wherein the at least one first and second element structures are made from piezoelectric material.

7. The method according to claim 6, wherein the first element and second element are in a poled relationship to one another of at least one of a series or parallel arrangement.

8. The method according to claim 1, wherein the steps of removing the first and second substrates is provided by an element liftoff process including, emitting, from a radiation source, a radiation beam through the first substrate to an attachment interface formed between the first substrate and the at least one first element structure at the surface of the first substrate, wherein the first substrate is substantially transparent at the wavelength of the radiation beam, and the radiation beam generates sufficient energy at the interface to break the attachment; and emitting, from a radiation source, a radiation beam through the second substrate to an attachment interface formed between the second substrate and the at least one second element structure at the surface of the second substrate, wherein the second substrate is substantially transparent at the wavelength of the radiation beam, and the radiation beam generates sufficient energy at the interface to break the attachment.

9. The method according to claim 1, wherein the first element structure is driven separately from the second element structure to generate displacement.

10. The method according to claim 1, wherein the final target substrate is at least one of silicon, metal or plastic.

11. The method according to claim 1, wherein the thicknesses of the first element structure and the second element structure are both within a range of about 1 $\mu$m to 100 $\mu$m.

12. The method according to claim 1, if the at least one first element structure or at least one second element structure is made from piezoelectric material, poling is conducted before bonding the at least one first element structure to the at least one second element structure.

* * * * *